United States Patent [19]

Mir et al.

[11] Patent Number: 5,070,072

[45] Date of Patent: Dec. 3, 1991

[54] CONDUCTIVE ARTICLES AND PROCESSES FOR THEIR PREPARATION

[75] Inventors: Jose M. Mir, Webster; John A. Agostinelli, Rochester; David L. Peterson, Penfield; Gustavo R. Paz-Pujalt, Rochester; Brian J. Higberg, Pittsford; Gopalan Rajeswaran, Fairport, all of N.Y.

[73] Assignee: Eastman Kodak Company, Rochester, N.Y.

[21] Appl. No.: 329,049

[22] Filed: Mar. 27, 1989

Related U.S. Application Data

[62] Division of Ser. No. 46,593, May 4, 1987, Pat. No. 4,880,776.

[51] Int. Cl.$^5$ ................................................. B32B 9/00
[52] U.S. Cl. ............................................. 505/1; 505/701; 505/702; 505/703; 505/704; 428/209; 428/688; 428/901; 428/930; 361/397
[58] Field of Search ........................... 505/1, 701–704; 428/209, 688, 901, 930; 174/68.5; 361/397, 398

[56] References Cited

FOREIGN PATENT DOCUMENTS

EP A0289142 11/1988 European Pat. Off. .

OTHER PUBLICATIONS

Hammond et al., "Superconducting Thin Films of the Perovskite Superconductors by Electron-Beam Deposition", *Extended Abstracts High Temperature Superconductors*, Anaheim California, Spring Meeting of the Materials Research Society, 23rd–24th Apr. 1987, pp. 169–171.

Koinuma et al., "Preparation of $(La_{1-x}Sr)_2CuO_4$ Superconducting Films by Screen Printing Method", *Japanese Journal of Applied Physics*, vol. 26, No. 4, Apr. 1987, pp. L399–L401.

Koinuma et al., "Some Problems in the Preparation of Superconducting Oxide Films on Ceramic Substrates", *Japanese Journal of Applied Physics*, vol. 26, No. 5, Part 2, May 1987, pp. L763–L765.

J. G. Bednorz et al., "Possible High $T_c$ Superconductivity in the Ba–La–Cu–O System", *Z. Phys. B.–Condensed Matter*, vol. 64, pp. 189–193 (1986).

C. W. Chu et al., "Evidence for Superconductivity Above 40 K in the La–Ba–Cu–O Compound System", *Physical Review Letters*, vol. 53, No. 4, pp. 405–407, Jan. 1987.

C. W. Chu et al., "Superconductivity at 52.5 K in the Lanthanum–Barium–Copper–Oxide System", *Science Reports*, vol. 235, pp. 567–569, Jan. 1987.

R. J. Cava et al., "Bulk Superconductivity at 36 K in $La_{1.8}Sr_{0.2}CuO_4$", *Physical Review Letters*, vol. 58, No. 4, pp. 408–410, Jan. 1987.

J. M. Tarascon et al., "Superconductivity at 40 K in the Oxygen–Defect Perovskites $La_{2-x}Sr_xCuO_{4-y}$", *Science Reports*, vol. 235, pp. 1373–1376, Mar. 13, 1987.

M. K. Wu et al., "Superconductivity at 93 K in a New Mixed-Phase Y–Ba–Cu–O Compound System at Ambient Pressure", *Physical Review Letters*, vol. 58, No. 9, pp. 908–910, Mar. 2, 1987.

Primary Examiner—Patrick J. Ryan
Attorney, Agent, or Firm—Carl O. Thomas

[57] ABSTRACT

Articles are disclosed in which an electrically conductive layer on a substrate exhibits a superconducting transition temperature in excess of 30° K. Conductive layers are disclosed comprised of a crystalline rare earth alkaline earth copper oxide. Processes of preparing these articles are disclosed in which a mixed metal oxide precursor composition is coated and heated to its thermal decomposition temperature to create an amorphous mixed metal oxide layer. The amorphous layer is then heated to its crystallization temperature.

47 Claims, 8 Drawing Sheets

CONDUCTIVE ARTICLES AND PROCESSES FOR THEIR PREPARATION

This is a division of U.S. Pat. Ser. No. 046,593, filed May 4, 1987, now U.S. Pat. No. 4,880,770, issued Nov. 14, 1989.

FIELD OF THE INVENTION

The present invention relates to articles having conductive coatings, to processes for preparing these articles, and to useful intermediate articles. In certain preferred forms this invention relates to articles having superconductive coatings and processes for their preparation.

BACKGROUND OF THE INVENTION

The term "superconductivity" is applied to the phenomenon of immeasurably low electrical resistance exhibited by materials. Until recently superconductivity had been reproducibly demonstrated only at temperatures near absolute zero. As a material capable of exhibiting superconductivity is cooled, a temperature is reached at which resistivity decreases (conductivity increases) markedly as a function of further decrease in temperature. This is referred to as the superconducting transition temperature or, in the context of superconductivity investigations, simply as the critical temperature ($T_c$). $T_c$ provides a conveniently identified and generally accepted reference point for marking the onset of superconductivity and providing temperature rankings of superconductivity in differing materials.

It has been recently recognized that certain rare earth alkaline earth copper oxides exhibit superconducting transition temperatures well in excess of the highest previously known metal oxide $T_c$, a 13.7° K. $T_c$ reported for lithium titanium oxide. These rare earth alkaline earth copper oxides also exhibit superconducting transition temperatures well in excess of the highest previously accepted reproducible $T_c$, 23.3° K. for the metal $Nb_3Ge$.

Recent discoveries of higher superconducting transition temperatures in rare earth alkaline earth copper oxides are reported in the following publications:

P—1 J.G. Bednorz and K.A. Muller, "Possible High $T_c$ Superconductivity in the Ba—La—Cu—O— System", Z. Phys. B. Condensed Matter. Vol. 64, pp. 189–193 (1986) revealed that polycrystalline compositions of the formula $Ba_xLa_{5-x}Cu_5O_{5(3-y)}$, where x=1 and 0.75 and y>0 exhibit superconducting transition temperatures in the 30° K. range.

P—2 C.W. Chu, P.H. Hor, R.L. Meng, L. Gao, Z.J. Huang, and Y.Q. Wang, "Evidence for Superconductivity above 40 K in the La—Ba—Cu—O— Compound System", Physical Review Letters, Vol. 53. No. 4. pp. 405–407. Jan. 1987, reported increasing $T_c$ to 40.2° K. at a pressure of 13 kbar. At the end of this article it is stated that M.K. Wu increased $T_c$ to 42° K. at ambient pressure by replacing Ba with Sr.

P—3 C.W. Chu, P.H. Hor, R.L. Meng, L. Gao, and Z J. Huang, "Superconductivity at 52.5 K in the Lanthanum Barium Copper Oxide System", Science Reports, Vol. 235, pp. 567–569, Jan. 1987, a $T_c$ of 52.5° K. for $(La_{0.9}Ba_{0.1})_2CuO_{4-y}$ at high pressures.

P—4 R.J. Cava, R.B. vanDover, B. Batlog, and E.A. Rietman, "Bulk Superconductivity at 36 K in $La_{1.8}Sr_{0.2}CuO_4$", Physical Review Letters, Vol. 58, No. 4, pp. 408–410, Jan. 1987. reported resistivity and magnetic susceptibility measurements in $La_{2-x}Sr_xCuO_4$, with a $T_c$ at 36.2° K. when x=0.2.

P—5 J.M. Tarascon, L.H. Greene, W.R. McKinnon, G.W. Hull, and T.H. Geballe, "Superconductivity at 40 K in the Oxygen Defect Perovskites $La_{2-x}Sr_xCuO_{4-y}$", Science Reports, Vol. 235, pp. 1373–1376. Mar. 13. 1987. reported title compounds ($0.05 \leq x \leq 1.1$) with a maximum $T_c$ of 39.3° K.

P—6 M.K. Wu, J.R. Ashburn, C.J. Torng, P.H. Hor, R.L. Meng, L. Gao, Z.J. Huang, Y.Q. Wang, and C.W. Chu, "Superconductivity at 93 K in a New Mixed Phase Y—Ba—Cu—O Compound System at Ambient Pressure", Physical Review Letters, Vol. 58, No. 9, pp. 908–910, Mar. 2, 1987, reported stable and reproducible superconducting transition temperatures between 80 and 93° K. at ambient pressures for materials generically represented by the formula $(L_{1-x}M_x)_aA_bD_y$, where L=Y, M=Ba, A=Cu, D=O, x=0.4, a=2, b=1, and y=4.

The experimental details provided in publications P—1 through P—6 indicate that the rare earth alkaline earth copper oxides prepared and investigated were in the form of cylindrical pellets produced by forming an amorphous oxide by firing, grinding or otherwise pulverizing the amorphous oxide, compressing the particulate amorphous oxide formed into cylindrical pellets, and then sintering to produce a polycrystalline pellet. While cylindrical pellets are convenient articles for cooling and applying resistance measuring electrodes, both the pellets and their preparation procedure offer significant disadvantages to producing useful electrically conductive articles, particularly articles which exhibit high conductivity below ambient temperature—e.g., superconducting articles. First. the step of grinding or pulverizing the amorphous oxide on a commercial scale prior to sintering is both time and energy consuming and inherently susceptible to material degradation due to physical stress on the material itself, erosion of grinding machinery metal. and handling. Second, electrically conductive articles rarely take the form of pellets. Electrically conductive articles most commonly take the form of flexible elongated conductive articles—e.g., wires, and articles forming conductive pathways on a substrate, such as insulative and semiconductive substrates—e.g , printed and integrated circuits.

SUMMARY OF THE INVENTION

In one aspect this invention is directed to an article comprised of a substrate and an electrically conductive layer located on the substrate characterized in that the electrically conductive layer is comprised of a crystalline rare earth alkaline earth copper oxide.

In another aspect this invention is directed to an electrically conductive article comprised of a substrate and at least one electrically conductive layer characterized in that the conductive layer exhibits a superconducting transition temperature of at least 30° K.

In an additional aspect this invention is directed to an electrically conductive article comprised of a substrate and at least one electrically conductive layer characterized in that the conductive layer exhibits superconductivity at temperatures in excess of 10° K.

In still another aspect this invention is directed to an article comprised of a substrate and a layer of an amorphous metal oxide located on the substrate characterized in that the amorphous metal oxide is a rare earth alkaline earth copper oxide.

In still an additional aspect this invention is directed to a process comprising applying to a substrate metal oxide precursors and thermally decomposing the precursors. The process is characterized in that onto the substrate is coated a solution consisting essentially of a volatilizable film forming solvent and metal ligand compounds of each of rare earth, alkaline earth, and copper containing at least one thermally volatilizable ligand and the solvent and ligands are removed from the substrate, this step including heating in the presence of oxygen to form an amorphous rare earth alkaline earth copper oxide coating on the substrate.

In a more specific aspect this invention is directed to a process of forming a pattern of crystalline rare earth alkaline earth copper oxide on a substrate. The process comprises (a) coating onto the substrate a solution consisting essentially of a volatilizable film forming solvent and metal ligand compounds of each of rare earth, alkaline earth, and copper containing at least one thermally volatilizable ligand, (b) removing the solvent and ligands from the substrate, this step including heating in the presence of oxygen to form an amorphous rare earth alkaline earth copper oxide coating on the substrate, (c) forming a photoresist pattern on the amorphous coating, (d) removing the amorphous coating not protected by the photoresist pattern, (e) removing the photoresist pattern, and (f) converting the amorphous rare earth alkaline earth copper oxide remaining on the substrate to a crystalline coating by heating the amorphous coating to a temperature at which crystallization of the rare earth alkaline earth copper oxide occurs.

In another specific aspect this invention is directed to a process of producing a flexible elongated electrical conductor comprising transporting a flexible elongated substrate through a coating zone where it is coated with a precursor of an electrical conductor and transporting the substrate from the coating zone into a heating zone to convert the precursor to an electrically conductive form. The process is characterized in that (a) in the coating zone the substrate is brought into contact with a solution consisting essentially of a volatilizable film forming solvent and metal ligand compounds of each of rare earth, alkaline earth, and copper containing at least one thermally volatilizable ligand, (b) in a first region of the heating zone the solvent and ligands are removed from the substrate. this step including heating in the presence of oxygen to form an amorphous rare earth alkaline earth copper oxide coating on the substrate, and (c) in a second region of the heating zone the amorphous rare earth alkaline earth copper oxide is converted to an electrically conductive form by heating the amorphous oxide to a temperature at which crystallization of the rare earth alkaline earth copper oxide occurs.

The present invention makes available to the art for the first time articles containing an electrically conductive rare earth alkaline earth copper oxide layer. In addition the present invention makes available to the art for the first time an electrically conductive article providing a coating on a support having a superconducting transition temperature in excess of 30° K. Further, these articles are capable of being fabricated in any of the most commonly employed geometrical forms of electrically conductive elements. This invention makes possible electrically conductive elongated articles, such as elongated flexible articles employed for the fabrication of leads and windings in electrical circuits as well as electrically conductive articles exhibiting circuit patterns—e.g., printed, hybrid, and integrated circuits. The present invention also makes available to the art unique thin film elements.

Additionally the present invention makes available to the art intermediate articles which can be further fabricated by subsequent fabricators to satisfy specific circuit applications. That is, the present invention makes available intermediate articles which can be processed further to produce desired circuitry.

The articles of this invention can be fabricated by techniques that avoid the disadvantages of the prior art. No grinding or pulverizing steps are required. In addition, the fabrication processes of this invention lend themselves to fabrication of articles of the most commonly employed electrical conductor geometrical forms. Specific processes of the invention allow conductive layer patterning. Further, conductive layers and pathways can be formed in the articles of the invention with minimal heating of the substrate.

BRIEF DESCRIPTION OF THE DRAWINGS

These and other advantages of the invention can be better appreciated by reference to the following detailed description of preferred embodiments considered in conjunction with the drawings, in which.

DESCRIPTION OF PREFERRED EMBODIMENTS

The present invention has as its purpose to make available electrically conductive articles exhibiting a rare earth alkaline earth copper oxide conductive layer coated on a substrate. The term "rare earth alkaline earth copper oxide" refers to a composition of matter containing at least one rare earth element, at least one alkaline earth element, cooper, and oxygen. The term "rare earth" is employed to designate yttrium and lanthanides—i.e., elements of the lanthanide series. Lanthanum, samarium, europium, gadolinium, dysprosium, holmium, erbium, and ytterbium are particularly preferred lanthanides. The term "alkaline earth" indicates elements of Group 2 of the Periodic Table of elements as adopted by the American Chemical Society. Calcium, strontium and barium are preferred alkaline earth elements for the practice of this invention.

In keeping with the established practice in the ceramics art of shortening lengthy chemical names of mixed metal oxides by substituting acronyms based on the first letters of the metals present, the term "RAC" is hereinafter employed to indicate generically rare earth alkaline earth copper oxides. When it is intended to designate specifically a lanthanide or yttrium as the rare earth component, L or Y, respectively, is substituted for R., and when it is intended to designate specifically strontium or barium as the alkaline earth component, S or B, respectively, is substituted for A.

Except as otherwise noted, all steps in the preparation of electrically conductive articles according to this invention are understood to be practicable in air at atmospheric pressure. It is, of course, recognized that increasing the proportion of ambient oxygen present and operation at elevated pressures, used separately or together, is generally compatible with the practice of this invention and can be employed, although not required.

Figure 1:
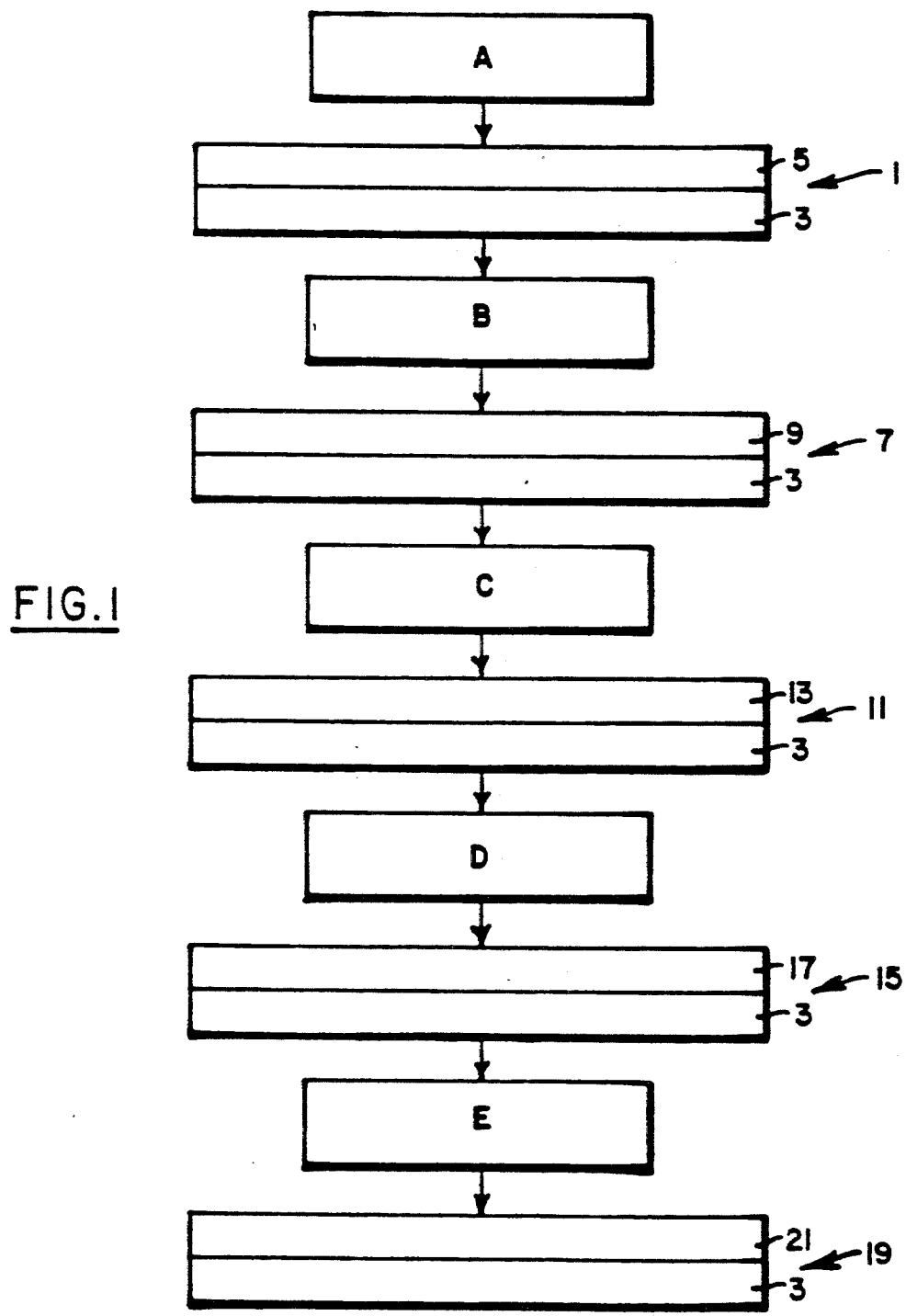
FIG. 1 is schematic diagram showing process steps and articles produced thereby.

The present invention can be appreciated by the schematic diagram shown in FIG. 1. In Step A of the preparation process, onto a substrate is coated a solution consisting essentially of a volatilizable film forming solvent and metal ligand compounds of each of rare earth, alkaline earth, and copper containing at least one thermally volatilizable ligand. The resulting coated article 1 as schematically shown consists of substrate 3 and a layer 5 formed by RAC precursors (metal.-ligand compounds) and film forming solvent.

In Step B article 1 is heated to a temperature sufficient to volatilize the ligands and the film forming solvent. The element 7 resulting consists of substrate 3 and amorphous RAC layer 9. In its amorphous form the RAC coating exhibits relatively low levels of electrical conductivity.

To convert the amorphous RAC layer to a more highly conductive form it is necessary to induce crystallization of the RAC layer. In Step C the article 7 is heated to a temperature sufficient to convert the amorphous RAC layer to a more electrically conductive crystalline form. In article 11 the RAC layer 13 on substrate 3 is crystalline.

Crystallization of the RAC layer occurs in two stages—crystal nucleation and crystal growth. It is in some instances preferred to achieve crystal nucleation at a somewhat different temperature than is employed for crystal growth. Microscopic examination of articles at an early stage of crystallization reveals crystal nuclei surrounded by at least one other RAC phase. Further heating of the RAC layer at the temperature of nucleation or, preferably, at a somewhat higher temperature increases the size of the crystal nuclei at the expense of the surrounding RAC phase or phases until facets of adjacent crystals are grown into electrically conductive juxtaposition.

According to accepted percolation theory, for a layer consisting of conducting spheres located in a surrounding nonconducting medium the spheres must account for at least 45 percent by volume of the layer for satisfactory electrical conductivity to be realized. If conducting particles of other geometric forms, particularly elongated forms, are substituted for the spheres, the conducting particles can account for less of the layer volume while still realizing satisfactory layer electrical conductivity. Similarly, electrical conductivity can be realized with a lesser proportion of conducting particles when the surrounding medium is also conductive. Thus, all layers containing at least 45 percent by volume electrically conductive particles are by theory electrically conductive.

Although satisfactory electrical conductivity can be realized with a lesser volume of the crystalline phase, it is generally contemplated that in the crystallized RAC layer the crystalline phase will account for at least 45 percent by volume and preferably 70 percent by volume of the total RAC layer. From microscopic examination of highly crystalline RAC layers exhibiting high levels of electrical conductivity it has been observed that layers can be formed in which little, if any, of the RAC phase surrounding the crystal nuclei remains. In other words greater than 90 percent (and in many instances greater than 99 percent) by volume of the RAC layer is accounted for by the desired crystalline phase.

To achieve crystallization the RAC layer can be heated to any convenient temperature level. To avoid interaction with less than inert substrates, it is generally preferred that heating of the RAC layer be heated no higher than is required for satisfactory crystallization. Heating to achieve crystallization can, for example, be limited to temperatures below the melting point of the RAC composition forming the layer. Microscopic examination of coatings of some RAC compositions has revealed that extending heating temperatures or times beyond those producing crystallization can result in rounding of crystal corners and edges. It is believed that the rounding resulting from further heating reduces the area of contact between adjacent crystal facets and thus restricts the conduction path through the crystalline RAC layer. From microscopic examination of RAC layers optimum heating times can be selected for maximizing both the proportion of the RAC layer accounted for by the crystalline phase and the desired configuration of the crystals produced, thereby maximizing electrical conductivity.

Step D entails controlled cooling of the RAC layer from its crystallization temperature. By slowing the rate of cooling of the crystalline RAC layer imperfections in the crystal lattices can be reduced and electrical conductivity, which is favored with increasing order in the crystal structure, is increased. Cooling rates of 25° C. per minute or less are contemplated until the crystalline RAC layer reaches a temperature of at least 500° C. or, preferably, 200° C. Below these temperatures the lattice is sufficiently rigid that the desired crystal structure is well established. The article 15 produced is formed of the annealed crystalline RAC layer 17 on substrate 3.

While the article 15 exhibits high levels of electrical conductivity, in some instances further heating of the article 15 in an oxygen enriched atmosphere has been observed to increase electrical conductivity further. In addition to oxygen supplied from the ligands the oxygen forming the crystalline RAC layer is obtained from the ambient atmosphere, typically air. It is believed that in some instances, depending upon the crystal structure being produced, ambient air does not provide the proportion of oxygen needed to satisfy entirely the available crystal lattice sites.

Therefore, optional Step E entails heating the article 15 in an oxygen enriched atmosphere, preferably pure oxygen. The object is to equilibrate the RAC crystalline layer with the oxygen enriched atmosphere, thereby sufficient oxygen into the crystal lattice structure. Temperatures for oxygen enrichment of the crystalline RAC layer are above the minimum annealing temperatures employed in Step D described above. To be effective in introducing oxygen into the crystal lattice temperatures above those at which the lattice becomes rigid are necessary. The duration and temperature of heating are interrelated, with higher temperatures allowing shorter oxygen enrichment times to be employed. Substantially complete oxygen equilibration can be realized at near minimum temperatures in about 1 hour.

In preparing RAC layers shown to be benefitted by oxygen enrichment of the ambient atmosphere Step E can be consolidated with either or both of Steps C and D. Oxygen enrichment is particularly compatible with Step D, allowing annealing out of crystal lattice defects and correction of crystal lattice oxygen deficiencies to proceed concurrently.

The final electrically conductive article 19 is comprised of a crystalline, electrically conductive RAC layer 21 on substrate 3. Depending upon specific choices of materials and preparation techniques, the article 19 can exhibit a high superconducting transition temperature, herein employed to designate a $T_c$ of greater than 30° C.

The process described for preparing electrically conductive articles having RAC layers offers several distinct advantages. One of the most significant advantages is that the proportions of rare earth, alkaline earth, and copper elements in the final RAC layer 21 exactly correspond to those present in the RAC precursor layer 5. In other words, the final proportion of rare earth, alkaline earth, and copper elements is determined merely by mixing in the desired proportions in the film forming solvent the metal ligand compounds employed as starting materials. This avoids what can be tedious and extended trial and error adjustments of proportions required by commonly employed metal oxide deposition techniques, such as sputtering and vacuum vapor deposition. Further, the present process does not require any reduction of atmospheric pressures, and thus no equipment for producing either high or low vacuum.

A further significant advantage of the process of this invention is that it can be applied to the fabrication of electrically conductive articles of varied geometry, particularly those geometrical forms of electrical conductors most commonly employed.

The present invention lends itself readily to the preparation of elongated electrically conductive articles, particularly flexible elongated electrically conductive articles, such as those employed as electrical leads, conductive windings in electro-magnets, conductive armature and/or field windings in electrical motors and generators, conductive windings in transformers, conductive windings in solenoids, and as long distance electrical transmission lines. Contemplated flexible elongated electrically conductive articles include those referred to in the art as rods, wires, fibers, filaments, threads, strands, and the like. In addition conductive cladding of ribbons, sheets, foils, and films is contemplated.

A coating process particularly adapted to coating flexible substrates can be illustrated by reference to FIG. 2, wherein an elongated flexible substrate 25 is unwound from a supply spool 27 and passed downwardly over a guide roller 29 into a reservoir 31. The reservoir contains a film forming solvent with metal ligand compounds dissolved therein, as described above in connection with Step A, shown as a liquid body 33. The flexible substrate is drawn over a lower guide roller 35 while immersed in the liquid and then passed upwardly to a third guide roller 37.

As the flexible substrate is drawn upwardly it emerges from the liquid body bearing an annular thin, uniform surface layer corresponding to layer 5 in FIG. 1. Between the reservoir and the third guide roller the coated substrate is drawn through a heating zone to complete in different regions of the heating zone process Steps B, C, D, and E sequentially as previously described. To accommodate needs for different residence times within the various heating regions the lengths of the different regions can be adjusted. Additionally, residence time of a substrate within any heating region can be further increased by employing laterally diverting guides, so one or a number of coated substrate festoon like path diversions are created within the heating region.

After passing over the third guide roller the substrate, bearing an annular crystalline electrically conductive RAC layer is wound onto a storage spool 39. Where the RAC layer is coated on a flexible substrate, it is preferred to maintain the thickness of the RAC layer at 2 $\mu$m or less, preferably 1.0 $\mu$m or less, so that it exhibits adequate flexibility. Flexing of the RAC layer required by guiding and spooling by can be reduced by increasing the radius of curvature imposed by the third guide roller and storage spool.

Figure 2:
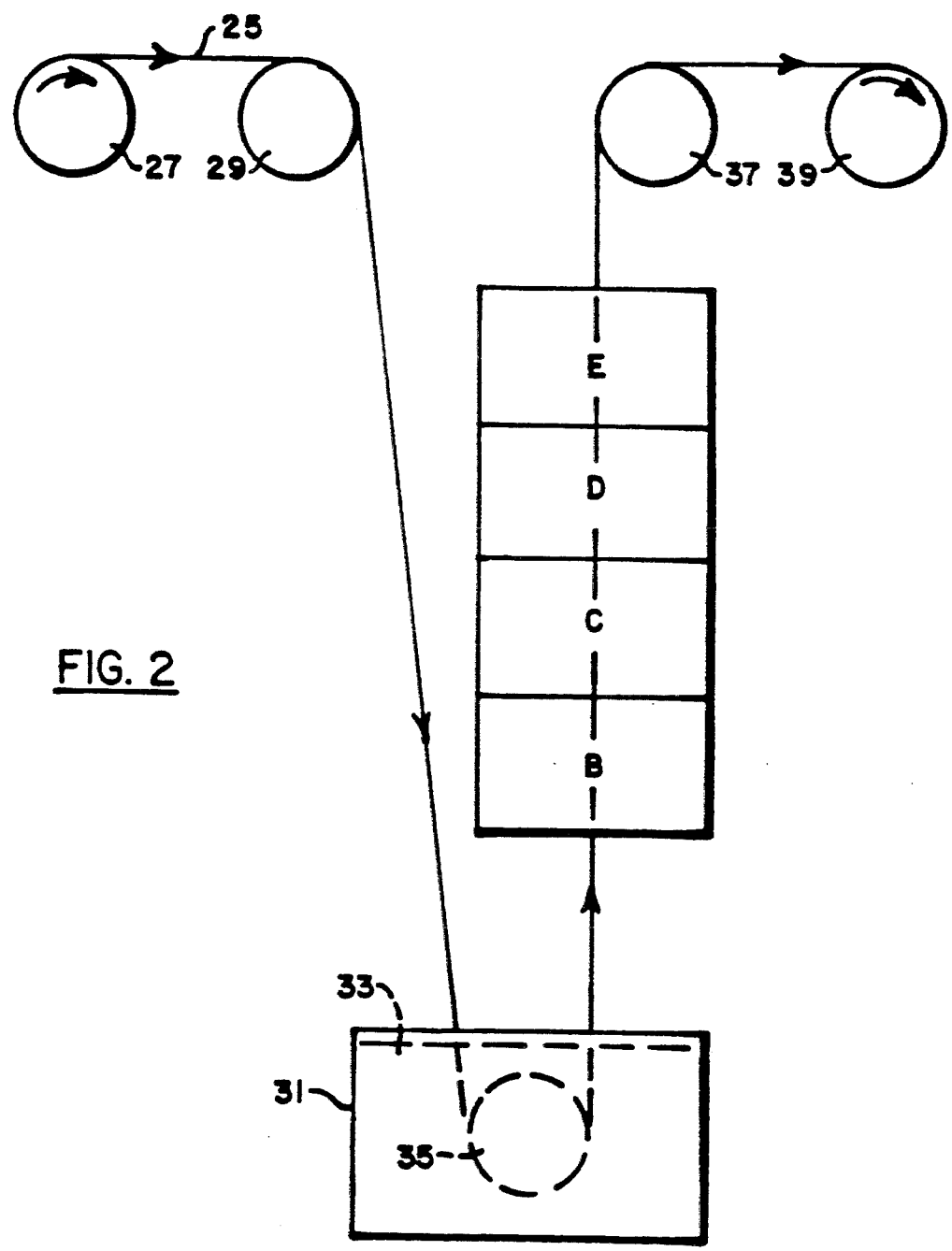
FIG. 2 is a schematic diagram of an arrangement for coating a elongated flexible substrate.

The arrangement shown in FIG. 2 for applying a flexible RAC layer to a flexible substrate is, of course, merely illustrative of a number of approaches which can be employed to apply a RAC layer to a flexible substrate. Where it is more convenient to perform process steps B, C, D, and E in a horizontally offset rather than vertically offset spatial relationship, instead of applying the RAC precursors and film forming solvent by immersion of the substrate, other conventional coating approaches can be employed for application, such as roll coating, spraying, brushing, curtain coating, extrusion, or the like. It is generally preferred to avoid guide contact of the coated substrate between application of the RAC precursors and completion of Step B. However, once a solid RAC layer exists on the substrate, guide contact with the substrate within or between any one of process Step C, D, and E locations can be undertaken, as desired for convenient spatial orientation.

While flexible electrical conductors of extended length serve a variety of important applications, there are many other applications for electrical conductors, particularly those located on limited portions of substantially planar surfaces of substrates. Such applications include those served by conventional printed, integrated, and hybrid circuits. In such circuits limited, if any, flexibility of the electrical conductor is required, but an ability to define areally—i.e, pattern, the electrical conductor with a high degree of precision is in many instances of the utmost importance. The present invention is compatible with precise patterning of the electrical conductor on a substrate surface.

Figure 3:
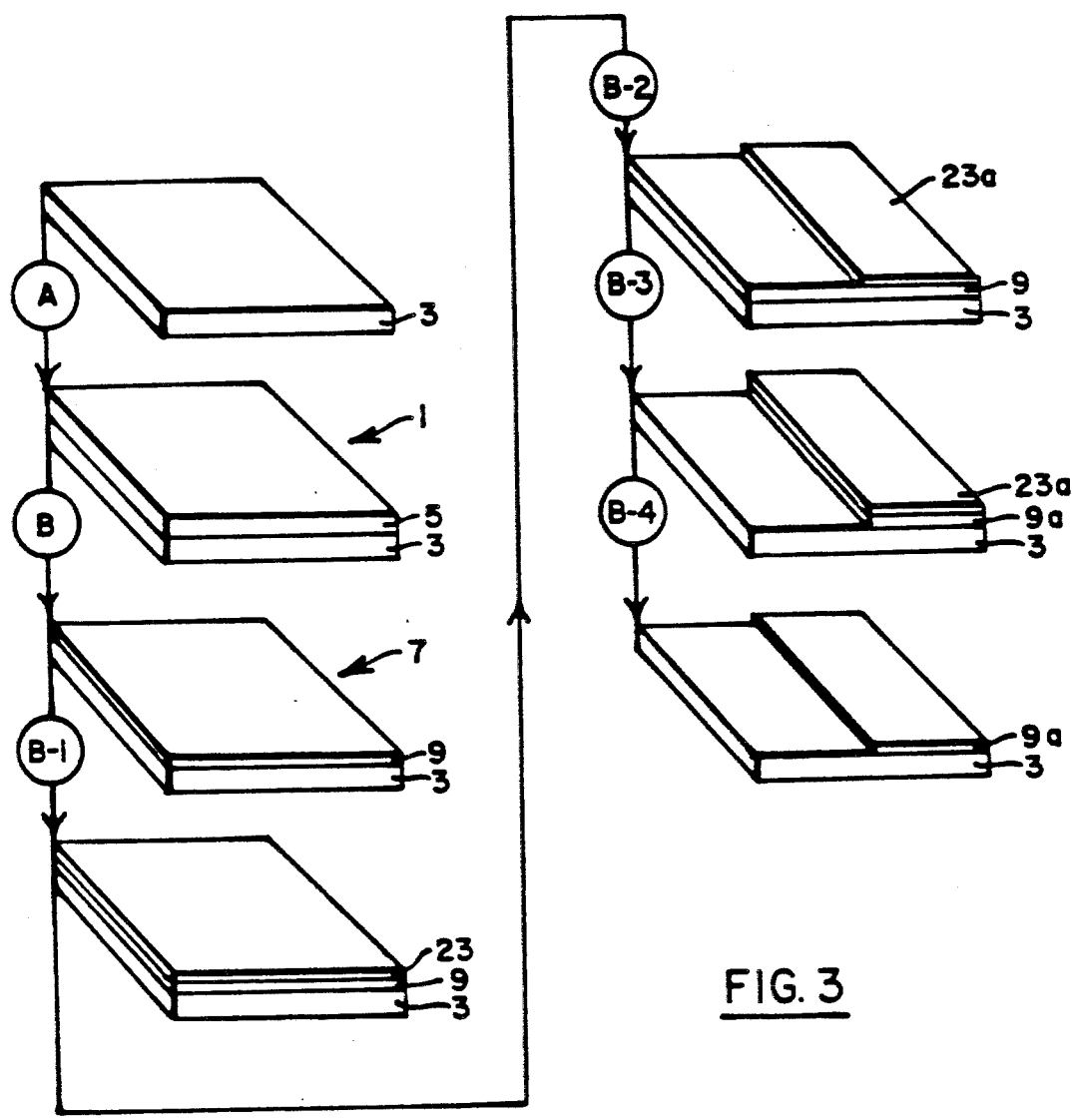
FIG. 3 is a schematic diagram of process steps and articles formed thereby capable of forming a patterned conductor on a substrate and FIGS. 4 through 8 are plots of temperature in degrees Kelvin versus resistance, measured in ohms or kiloohms, as indicated.

Patterning of an electrical conductor according to this invention is illustrated by reference to FIG. 3. Substrate 3 is coated on its upper planar surface with a uniform RAC precursor layer 5 as described above in connection with process Step A to form initial coated article 1. Process Step B, described above, is performed on article 1 to produce article 7, described above, comprised of amorphous RAC layer 9 and substrate 3.

The amorphous RAC layer lends itself to precise pattern definition and produces results generally superior to those achieved by patterning the RAC precursor layer from which it is formed or the crystalline RAC layer which is produced by further processing. The RAC precursor layer is often liquid before performing process Step B and is in all instances softer and more easily damaged in handling than the amorphous RAC layer. The crystalline RAC layer cannot be etched with the same boundary precision as the amorphous RAC layer, since etch rates vary from point to point based on local variations in the crystal faces and boundaries presented to the etchant. Patterning of either the RAC precursor layer or the crystalline RAC layer is specifically recognized as a viable alternative to patterning the amorphous RAC layer for applications permitting more tolerance of conductor dimensions. For example, screen printing the RAC precursor layer on a substrate to form a printed circuit is specifically contemplated.

While the amorphous RAC layer can be patterned employing any conventional approach for patterning metal oxides, for more precise edge definitions the preferred approach is to photopattern the amorphous RAC layer employing any of the photoresist compositions conventionally employed for the precise definition of printed circuit or integrated circuit conductive layers. In a preferred form of the process, a uniform photoresist layer 23 is applied to the amorphous RAC layer 9 as indicated by process Step B-1. The photoresist layer can be formed by applying a liquid photoresist composition to the substrate, spinning the substrate to insure uniformity of the coating, and drying the photoresist. Another approach is to laminate a preformed photoresist layer supported on a transparent film to the amorphous RAC layer.

The photoresist layer is then imagewise exposed to radiation, usually through a mask. The photoresist can then be removed selectively as a function of exposure by development. Positive working photoresists are removed on development from areas which are exposed to imaging radiation while negative working photoresists are removed only in areas which are not exposed to imaging radiation. Exposure and development are indicated by process Step B-2. Following this step patterned photoresist layer 23a is left on a portion or portions of the amorphous RAC layer 9. Although the patterned residual photoresist layer is for convenience shown of a simple geometrical form, it is appreciated that in practice the patterned photoresist can take any of a wide variety of geometrical forms, including intricate and thin line width patterns, with line widths ranging into the sub micrometer range.

Following patterning of the photoresist layer, portions of the RAC layer which are not protected by the photoresist can be selectively removed by etching, as indicated by process Step B-3. This converts the amorphous RAC layer 9 to a patterned RAC layer 9a confined to areas corresponding to that of the photoresist.

Following patterning of the amorphous RAC layer the patterned photoresist is removed, as indicated by process Step B-4. The final article as shown in FIG. 3 consisting of the substrate 3 and patterned amorphous RAC layer 9a is then further processed as indicated in FIG. 1, picking up with process Step C. The crystalline RAC layer formed in the final product conforms to the patterned amorphous RAC layer.

In the process of preparing a patterned article described above it is noted that once an article is formed having an amorphous RAC layer on a substrate it can be patterned to serve any of a wide variety of circuit applications, depending upon the circuit pattern chosen. It is therefore recognized that instead of or as an alternative to offering patterned articles for sale a manufacturer can instead elect to sell articles with unpatterned amorphous RAC layers, with or without an unpatterned photoresist layer, to subsequent fabricators. It will often be convenient in this instance to locate a removable layer or film over the amorphous RAC layer for its protection prior to further fabrication. The subsequent fabricator can undertake the patterned exposure and further processing required to produce a finished electrically conductive article.

To crystallize a RAC layer and to perform the optional, but preferred annealing and oxygen enrichment steps both the substrate and RAC layer are heated uniformly. This can be done employing any conventional oven. In some instances, however, either to protect the substrate from rising to the peak temperatures encountered by the RAC layer or simply to avoid the investment in an oven by fabricator, it is contemplated that the RAC layer will be selectively heated. This can be accomplished by employing a radiant heat source, such as a lamp—e.g., a quartz lamp. Lamps of this type are commercially available for achieving rapid thermal annealing of various conventional layers and can be readily applied to the practice of the invention. These lamps rapidly transmit high levels of electromagnetic energy to the RAC layer, allowing it to be brought to its crystallization temperature without placing the substrate in an oven.

A diverse approach for producing patterned electrical conductors can be practiced by employing article 7 comprised of the uniform amorphous RAC layer 9 and substrate 3 as a starting element. Instead of patterning the amorphous RAC layer followed by crystallization of the remaining portions of the layer, the amorphous RAC layer is imagewise addressed to produce crystallization selectively only in areas intended to be rendered electrically conductive. For example, by addressing the amorphous RAC layer with a laser areas directly impinged by the laser beam can be selectively crystallized to an electrically conductive form leaving the remaining amorphous areas unaffected. To define the conductive pattern generated it is only necessary to control the path of the laser beam.

Where a manufacturer chooses to sell an article consisting of a uniform amorphous RAC layer on a substrate, this approach to patterning can be more attractive than the uniform heating processes described above, since no oven is required to reach the temperatures typically required for crystallization. The fabricator choosing laser patterning may, in fact, require no other heating equipment. Thus, a very simple approach to forming a crystalline RAC pattern is available.

It is, of course, recognized that additional heating for purposes of annealing or oxygen saturation can be undertaken, following lamp or laser crystallization, by heating in any desired manner. One approach is to heat at least amorphous layer 9 of the article 7 to a temperature above its minimum annealing temperature and then laser address the heated article. This facilitates annealing and oxygen enrichment without requiring uniformly heating the entire article to the significantly higher levels otherwise required for crystal nucleation and growth.

Another variation on the laser patterning approach is to follow the laser responsible for crystallization with one or more passes from a lower intensity laser beam to retard the rate of cooling and thereby enhance annealing. For example, a laser beam can be swept across an area of the substrate surface to produce crystallization and then reduced in intensity or defocused and swept back across the same area to facilitate annealing. By defocusing the laser beam on subsequent passes over the same area the laser energy is spread over a larger area so that the maximum effective temperature levels achieved are reduced. The advantage of employing one laser for multiple passes is that alignments of laser beam paths are more easily realized. Additionally or alternatively, the rapidity with which the laser is swept across the exposed area can be adjusted to control the temperature to which it heats the RAC layer. Other laser scanning variations are, of course, possible.

Both lamp heating and laser canning allow a broader range of substrates to be considered, particularly those which, though capable of withstanding ligand and solvent volatilization temperatures, are susceptible to degradation at crystallization temperatures. By choosing wavelengths in spectral regions to which the amorphous RAC layer is opaque or at least highly absorbing, direct radiant heating of the substrate can be reduced or eliminated. In this instance the bulk of the radiation is intercepted in the RAC layer before it reaches the substrate. The substrate can also be protected from direct radiant heating by choosing a substrate composition that is transparent to or minimally absorptive of the laser radiation. Since lasers emit coherent electromagnetic radiation of a single wavelength, high selectivity of absorption or transmission is much more readily achieved than when absorption or transmission must be averaged over a wavelength region of the spectrum.

In considering crystallization of a RAC layer by radiant energy to which the RAC layer is opaque or at least highly absorptive and employing a substrate which is substantially transparent to the radiant energy, whether supplied from a lamp or laser, advantages can be realized by supplying the radiant energy to the RAC layer through the substrate. Where a substantially transparent substrate is employed, little of the radiant energy is attenuated in traversing the substrate. The RAC layer adsorbs the radiant energy adjacent its interface with the substrate. Thus, crystallization of the RAC layer can be initiated at this interface. By choosing a substrate of a crystal structure compatible with that of the crystals to be formed in the RAC layer, crystal growth in the RAC layer can occur epitaxially at the interface of the RAC layer and the substrate. In one form the substrate can be of the same crystalline form sought in the RAC layer—e.g., a tetragonal $K_2NiF_4$ or $R_1A_2C_3$ crystalline form. However, it is not essential that the substrate have the same crystal structure as the RAC layer for epitaxial deposition to occur. What is most important is that the substrate present a surface for deposition of the RAC layer that at least approximates the spatial frequency of atoms favorable for epitaxy. For example, it is possible to slice a monocrystalline substrate so that it presents a planar surface having a frequency and spacing of oxygen atoms approximating that in the desired crystalline phase of the RAC layer. The spatial frequency of oxygen atoms at the surface of the substrate can be chosen to match or approximate that of a tetragonal $K_2NiF_4$ or $R_1A_2C_3$ crystalline form, for instance, even though the substrate takes a different crystalline form.

To avoid coating imperfections the thickness of an amorphous RAC layer produced in a single process sequence is maintained at 1 μm or less, preferably 0.6 μm or less, and optimally 0.4 μm or less, a single process sequence being understood to constitute the steps described above for forming an amorphous RAC layer. By repeating the process sequence one or more times an amorphous RAC layer of any desired thickness can be built up.

While ideal substrates are those which remain chemically nonreactive during fabrication of the crystalline RAC layer, in practice when RAC crystallization temperatures are encountered by the substrate at least some interaction of the RAC layer occurs with all but the most stable of substrates. In some instances less than hoped for levels of electrical conductivity have been observed, believed to be attributable to interaction of the crystallized RAC layer with its substrate at their mutual interface. Unwanted reductions in $T_c$ and zero resistivity temperatures are believed to be unwanted manifestations of substrate interaction with the crystalline RAC layer.

To minimize unwanted interaction of the RAC layer with the substrate it is specifically contemplated to interpose a barrier between the substrate and the RAC layer. It has been observed that each time the the process sequence required for forming the amorphous RAC layer is repeated before proceeding on to the crystallization step of the process substrate interaction with the crystalline RAC layer is reduced, as reflected in its electrical conductivity properties, even where microscopic examination reveals individual grains or microcrystals extending from at or near the substrate to the top of the RAC layer. In this instance the portion of the crystalline RAC layer adjacent the substrate is acting as a barrier protecting the portion of the RAC layer remote from the substrate.

An alternative is to interpose between the substrate and the crystalline RAC layer a barrier of a different composition. The interposed barrier layer can itself take the form of a crystalline RAC layer, differing in the specific RAC composition chosen. In this instance the barrier layer can be viewed as a second crystalline RAC layer, which can, if desired, perform electrical conduction as well as acting as a barrier. In other instances the barrier can be viewed as an extension of the substrate. For example, a ceramic substrate coated with a thin refractory metal layer or a semiconductor substrate coated with an oxide or nitride, each of which are in turn overcoated with a crystalline RAC layer, can be viewed as an article having a composite substrate supporting a crystalline RAC layer or an article having a unitary substrate, a crystalline RAC layer, and an interposed barrier.

Any rare earth alkaline earth copper oxide composition known to be convertible to a crystalline phase can be employed in forming the coated articles of this invention. For example, any of the RAC compositions disclosed in publications P-1 through P-6 can be formed and converted to a crystalline phase by the process of this invention.

Further, electrically conductive crystalline RAC layers can be formed on a wide variety of substrates. In general any conventional electrical conductor substrate capable of withstanding processing temperatures can be employed. For example, substrates in the form of metal wires, glass fibers, ceramic and glass plates, semiconductor wafers, and the like, all possess sufficient thermal stability to accept crystalline RAC layers applied by one or more of the procedures described above.

To achieve articles according to this invention which are not only electrically conductive, but also exhibit high $T_c$ levels, thereby rendering them attractive for high conductivity (e.g., superconducting) electrical applications, it has been observed that some combinations of substrates and rare earth alkaline earth copper oxides are particularly attractive in exhibiting higher $T_c$ levels and higher maximum temperatures at which superconductivity is in evidence.

One specifically preferred class of high $T_c$ articles according to this invention are those in which the crystalline RAC layer consists of greater than 45 percent by volume of a rare earth alkaline earth copper oxide which is in a tetragonal $K_2NiF_4$ crystalline phase. The $K_2NiF_4$ crystalline phase preferably constitutes at least 70 percent and optimally at least 90 percent by volume of the RAC layer.

A preferred rare earth alkaline earth copper oxide exhibiting this crystalline phase satisfies the metal ratio:

(I)
$$L_{2-x}:M_x:Cu$$

where
L is lanthanide,
M is alkaline earth metal and
x is 0.15 to 0.30.

Optimum results have been observed when x is 0.15 to 0.20 Among the preferred lanthanides, indicated above, lanthanum has been particularly investigated and found to have desirable properties. Preferred alkaline earth metals are barium and strontium. Optimum results have been observed when x is 0.15 to 0.20.

Thus, in specifically preferred forms of the invention LBC or LSC layers exhibiting a tetragonal $K_2NiF_4$ crystalline phase are present and capable of serving high conductivity applications, including those requiring high $T_c$ levels and those requiring superconductivity at temperatures in excess of 10° K. Specific LBC layers in the tetragonal $K_2NiF_4$ crystalline phase have been observed to have $T_c$ levels in excess of 40° K.

Another specifically preferred class of high $T_c$ articles according to this invention are those in which the crystalline RAC layer consists of greater than 45 percent by volume of a rare earth alkaline earth copper oxide which an $R_1A_2C_3$ crystalline phase, believed to be an orthorhombic Pmm2 or orthorhombically distorted perovskite crystal phase. This phase preferably constitutes at least 70 percent by volume of the RAC layer.

A preferred rare earth alkaline earth copper oxide exhibiting this crystalline phase satisfies the metal ratio:
(II)
$$Y:M_2:Cu_3$$

where
M is barium, optionally in combination with one or both of strontium and calcium.

Although the $R_1A_2C_3$ crystalline phase by its crystal lattice requirements permits only a specific ratio of metals to be present, in practice differing ratios of yttrium, alkaline earth, and copper are permissible. The metal in excess of that required for the $R_1A_2C_3$ crystalline phase is excluded from that phase, but remains in the YAC layer. This is further illustrated in the examples below.

As noted above, the formation of a particular crystalline orientation in the RAC layer can be facilitated by employing a substrate which presents a deposition surface of the same or a similar crystalline structure. For example, in seeking to form an oriented tetragonal $K_2NiF_4$ crystalline phase in a RAC layer on a substrate it is most advantageous to employ a substrate which at its interface with the RAC layer presents a tetragonal $K_2NiF_4$ crystal surface or a closely related crystal structure, such as a perovskite.

It has been demonstrated that the $R_1A_2C_3$ crystalline phase can be formed on a perovskite crystal surface. High $T_c$ articles consisting of LAC, particularly LSC, and YAC, particularly YBC, layers have been successfully formed on substrates presenting a perovskite crystal surface.

Alkaline earth oxides constitute a particularly preferred class of substrates. They are in general relatively inert, refractory materials which exhibit limited interaction with the RAC layers during their formation. Strontium titanate, because it can be readily formed in a perovskite crystalline form, constitutes a specifically preferred alkaline earth oxide substrate material. Although some interaction between alkaline earth oxide substrate and a contiguous RAC layer is believed to occur when the article is heated to temperatures above about 900° C., interaction effects can be minimized by employing the interposed barrier formation techniques, described above. It is generally preferred to perform the amorphous RAC layer formation processing sequence three to ten times to minimize substrate interaction effects. Alumina and magnesia are other examples of specifically contemplated oxide substrates.

To facilitate formation of the most highly uniform crystalline RAC layers it is preferred that the substrate itself be monocrystalline. Monocrystalline strontium titanate, alumina (sapphire) and magnesia (periclase) are all readily available substrate materials. Semiconductor wafers, particularly silicon and III-V compound wafers, also constitute useful classes of monocrystalline substrates for the articles of this invention.

Another specifically contemplated class of substrate materials are refractory metals. Such metals are, of course, well suited to withstanding RAC layer crystallization temperatures of 1000° C. or more. Refractory metals such as tungsten, tantalum, titanium, and zirconium are particularly contemplated. The refractory metal can form the entire substrate or a thermally resistant layer onto which the RAC layer is coated.

In the process of fabrication of this invention the formation of the desired RAC layer begins with the formation of a RAC precursor layer, such as layer 5 in article 1, shown in FIG. 1. To form the precursor layer a solution of a film forming solvent, a rare earth metal compound, an alkaline earth metal compound, and a copper compound is prepared. Each of the rare earth, alkaline earth, and copper compounds consists of metal ion and one or more volatilizable ligands. By "volatilizable" it is meant that the ligand or its component elements other than oxygen can be removed from the substrate surface at temperatures below the crystallization temperature of the RAC layer. In many instances organic ligands breakdown to inorganic residues, such as carbonates, at relatively low temperatures, with higher temperature being required to remove residual carbon. A ligand oxygen atom bonded directly to a metal is often retained with the metal in the RAC layer, although other ligand oxygen atoms are generally removed. At least 95 percent of the ligands and their component atoms other than oxygen are preferably outgassed at temperatures of less than 600° C. On the other hand, to avoid loss of materials before or during initial coating of the metal ligand compounds, it is preferred that the ligands exhibit limited, if any, volatility at ambient temperatures. Metal ligand compounds having any significant volatility below their decomposition temperature are preferably avoided in the practice of this invention.

Metalorganic compounds, such as metal alkyls, alkoxides, β-diketone derivatives, and metal salts of organic acids—e.g., carboxylic acids. constitute preferred metal-ligand compounds for preparing RAC precursor coatings. The number of carbon atoms in the organic ligand can vary over a wide range, but is typically limited to less than 30 carbon atoms to avoid unnecessarily reducing the proportion of metal ions present. Carboxylate ligands are particularly advantageous in promoting metal ligand solubility. While very simple organic ligands, such as oxalate and acetate ligands, can be employed in one or more metal ligands compounds, depending upon the film forming solvent and other metal-ligand compound choices, it is generally preferred to choose organic ligands containing at least 4 carbon atoms. The reason for this is to avoid crystallization of the metal ligand compound and to improve solubility. When heating is begun to remove the film forming solvent and ligands, the solvent usually readily evaporates at temperatures well below those required to remove the ligands. This results in leaving the metal-ligand compounds on the substrate surface. When the ligands have few carbon atoms or, in some instances, linear carbon atom chains, crystallization of the metal-ligand compounds occurs. In extreme cases crystallization is observed at room temperatures. This works against the molecular level uniformity of rare earth, alkaline earth, and copper ions sought by solution coating. Choosing organic ligands exhibiting 4 or more carbon atoms, preferably at least 6 carbon atoms, and, preferably, ligands containing branched carbon atom chains, reduces molecular spatial symmetries sufficiently to avoid crystallization. Optimally organic ligands contain from about 6 to 20 carbon atoms.

Instead of increasing the molecular bulk or modifying the chain configuration of organic ligands to avoid any propensity toward metalorganic compound crystallization on solvent removal, another technique which can be employed is to incorporate in the film forming solvent a separate compound to act as a film promoting agent, such as a higher molecular weight branched chain organic compound. This can, for example, take the form of a branched chain hydrocarbon or substituted hydrocarbon, such as a terpene having from about 10 to 30 carbon atoms.

The film forming solvents can be chosen from a wide range of volatilizable liquids. The primary function of the solvent is to provide a liquid phase permitting molecular level intermixing of the metalorganic compounds chosen. The liquid is also chosen for its ability to cover the substrate uniformly. Thus, an optimum film forming solvent selection is in part determined by the substrate chosen. Generally more desirable film forming properties are observed with more viscous solvents and those which more readily wet the substrate alone, or with an incorporated wetting agent, such as a surfactant, present.

It is appreciated that a wide variety of ligands, film promoting agents, and film forming solvents are available and can be collectively present in a virtually limitless array of composition choices.

Exemplary preferred organic ligands for metal organic compounds include metal 2-ethylhexanoates, naphthenates, neodecanoates, butoxides, isopropoxides, rosinates (e.g., abietates), cyclohexanebutyrates, and acetylacetonates, where the metal can be any of the rare earth, alkaline earth, or copper elements to be incorporated in the RAC layer. Exemplary preferred film promoting agents include 2-ethylhexanoic acid, rosin (e.g., abietic acid), ethyl lactate, 2-ethoxyethyl acetate, and pinene. Exemplary preferred film forming solvents include toluene, 2-ethylhexanoic acid, n-butyl acetate, ethyl lactate, propanol, pinene, and mineral spirits.

As previously noted, the metal-ligand compounds are incorporated in the film forming solvent in the proportion desired in the final crystalline RAC layer The rare earth, alkaline earth, and copper can each be reacted with the same ligand forming compound or with different ligand forming compounds. The metal-ligand compounds can be incorporated in the film forming solvent in any convenient concentration up to their saturation limit at ambient temperature. Generally a concentration is chosen which provides the desired crystalline RAC layer thickness for the process sequence. Where the geometry of the substrate permits, uniformity and thickness of the metal-ligand coating can be controlled by spinning the substrate after coating around an axis normal to the surface of the substrate which has been coated. A significant advantage of spin coating is that the thickness of the coating at the conclusion of spinning is determined by the contact angle and viscosity of the coating composition and the rate and time of spinning, all of which can be precisely controlled. Differences in the amount of the coating composition applied to the substrate are not reflected in the thickness of the final coating. Centrifugal forces generated by spinning cause excess material to be rejected peripherally from the article.

Although processing temperatures employed in forming the amorphous RAC layers and in subsequently converting the amorphous layers to crystalline layers can vary significantly, depending upon the specific RAC composition and crystal form under consideration, crystallization is in all instances achieved below the melting point of the RAC composition. Melting points for RAC compositions vary, but are typically well above 1000° C. Typical RAC crystallization temperatures are in the range of from about 900 to 1100° C. Where crystal nucleation and growth are undertaken in separate steps, nucleation is preferably undertaken at a somewhat lower temperature than crystal growth.

In some instances X-ray diffraction has revealed the presence of microcrystals in the amorphous RAC layer, although limited to minor amounts, typically less than about 5 percent, based on the total volume of the RAC layer. While crystallization of the metal ligand compounds, which tends to separate the metals into different phases, is generally avoided, crystallization which occurs during or immediately following ligand volatilization is not objectionable, since metals absent their ligands are free to form mixed metal oxides.

A preferred technique for producing a high $T_c$ coating employing an amorphous layer of the LAC composition metal ratio I above, particularly an LBC or LSC composition, is to heat the amorphous layer on the substrate to a temperature of about 925 to 975° C. to achieve crystal nucleation. Crystal growth is then undertaken at a temperature of about 975 to 1050° C. Following conversion of the LAC layer to the tetragonal $K_2NiF_4$ crystalline phase, it is cooled slowly at a rate of 25° C. or less per minute until it reaches a temperature of 550° to 450° C. The LAC layer is then held at this temperature or reheated to this temperature in the presence of an oxygen atmosphere until oxygen equilibration is substantially complete, typically about 20 to 120 minutes.

A preferred technique for producing a high $T_c$ coating employing an amorphous layer of the YAC composition satisfying metal ratio II above, particularly YBC, is to heat the amorphous layer on the substrate to a temperature of a temperature greater than 900° C., but less than 950° C., optimally 920° to 930° C. Following conversion of the YAC layer to the $R_1A_2C_3$ crystalline phase, it is cooled slowly at a rate (of 25° C. or less per minute until it reaches a temperature of 750° to 400° C. The YAC layer is then held at this temperature or reheated to this temperature following cooling in the presence of an oxygen atmosphere until oxygen equilibration is substantially complete, typically about 20 to 120 minutes.

From the foregoing description it is apparent that articles described above are comprised of a substrate and an electrically conductive layer located on the substrate. The electrically conductive layers is comprised of greater than 45 percent by volume of a crystalline rare earth alkaline earth copper oxide satisfying (Ia) or (IIa)

$$L_{2-x}:M_x:C:O_y \qquad (Ia)$$

$$Y_1:A_2:C_3:O_z \qquad (IIa)$$

where
A is alkaline earth;
C is copper;
L is lanthanide;
M is alkaline earth metal;
Y is yttrium;
x is 0.05 to 0.30;
y is the amount of oxygen that results from
  (a) heating an amorphous mixture of oxides of L, M and C satisfying the ratio $$L_{2-x}:M_x:C \qquad (I)$$

in the form of a coating having a thickness of 1 μm or less on the substrate to a temperature in the range of from 925° to 975° C. to form a crystalline phase,
  (b) effecting crystal growth by heating in the temperature range of from 975° to 1050° C., and
  (c) cooling the coating in the presence of oxygen at a rate of less than 25° C. per minute until it reaches a temperature of from 550° to 450° C.; and
z is the amount of oxygen that results from
  (a) heating an amorphous mixture of oxides of Y, A and C satisfying the ratio $$Y_1:A_2:C_3 \qquad (II)$$

in the form of a coating having a thickness of 1 μm or less on the substrate to a temperature in the range of from 900° to 950° C. to form a crystalline phase and
  (b) cooling the coating in the presence of oxygen at a rate of less than 25° C. per minute until it reaches a temperature of from 750° to 400° C.

EXAMPLES

Details of the preparation and performance of articles according to this invention are illustrated by the following examples.

Cu(II) precursor 1

A copper precursor composition containing copper (II) 2-ethylhexanoate was prepared by transcarboxylating 2 grams of cupric acetate with 5 grams of 2-ethylhexanoic acid. The composition was heated to boiling for 3 minutes to produce a total solution of 6.76 g, which was 9.4% by wt. Cu.

La precursor 1

A lanthanum precursor composition was prepared by transcarboxylating 2 grams of lanthanum acetate (40.5% by wt. La) with 8 grams of 2-ethylhexanoic acid to produce lanthanum 2-ethylhexanoate.

Y precursor 1

A yttrium precursor composition was prepared by transcarboxylating 2.7 grams of yttrium acetate with a stoichiometric excess (3.50 grams) of 2-ethylhexanoic acid to produce yttrium 2-ethylhexanoate.

Precursor LSC-1 $La_{4.5}:Sr_{0.5}:Cu_5$

One gram of La precursor 1 was mixed with 0.0248 gram of strontium 4 cyclohexanebutyrate and 0.2 gram toluene. The resulting composition was heated until the strontium compound was dissolved. Cu(II) precursor 1 was then added in the amount of 0.456 gram along with 0.8 gram of rosin. The composition was adjusted to a lower viscosity by adding 0.2 gram of toluene.

Precursor LSC-2 $La_{1.8}:Sr_{0.2}:Cu$

Two grams of La precursor 1 were mixed with 0.0499 gram of strontium 4 cyclohexanebutyrate. The resulting composition was heated until the strontium compound was dissolved. Cu(II) precursor 1 was then added in the amount of 0.456 gram along with 1.0 gram of rosin. The composition was adjusted to a lower viscosity by adding 0.2 gram of toluene.

Precursor LSC-3 $La_{1.85}:Sr_{0.15}:Cu$

Two grams of La precursor 1 were mixed with 0.0364 gram of strontium 4 cyclohexanebutyrate. The resulting composition was heated until the strontium compound was dissolved. Cu(II) precursor 1 was then added in the amount of 0.443 gram along with 1.0 gram of rosin. The composition was adjusted to a lower viscosity by adding 0.2 gram of toluene.

Precursor YBC-1 $Y:Ba_2:Cu_3$

One half gram of Y precursor 1, 0.67 gram of Ba cyclohexanebutyrate, 1.43 gram of Cu precursor 1, and 0.4 gram toluene were mixed and heated to boiling for about 30 seconds. One gram of rosin and 0.74 grams of toluene were then added. The composition was heated to dissolve the rosin.

Precursor YBC-2 $Y:Ba_3:Cu_4$

One gram of Cu precursor 1, 0.26 gram of Y precursor 1, and 0.53 gram of barium cyclohexane butyrate (28.86% by wt. Ba) were mixed with 1 gram of toluene and heated to boiling for 30 seconds at which time all ingredients were in solution. This was followed by the addition of 0.7 gram of rosin and 0.8 gram of toluene. The composition was heated to dissolve the rosin.

Precursor YBC-3 $Y:Ba_4:Cu_5$

One gram of Cu precursor 1, 0.21 gram of Y precursor 1, and 0.56 gram of barium cyclohexane butyrate (28.86% by wt. Ba) were mixed with 1 gram of toluene and heated to boiling for 30 seconds at which time all ingredients were in solution. This was followed by the addition of 0.7 gram of rosin and 0.8 gram of toluene. The composition was heated to dissolve the rosin.

Example 1

This example illustrates the preparation of a high $T_c$ (>30° K.) electrically conductive article prepared by forming an LSC layer on a strontium titanate substrate.

A monocrystalline strontium titanate (SrTiO$_3$) plate presenting a {100} upper crystal face was employed as a substrate. A small amount of Precursor LSC-2 was placed on the substrate, which was then spun at 5000 rpm for 20 seconds. A uniform, smooth coating was produced that exhibited no physical imperfections on visual inspection, confirming the favorable rheological properties of precursor LSC-2 as a coating composition.

The coated substrate was then heated on a hot plate to 550° C. to produce an amorphous LSC layer. This was followed by heating to 950° C. for 5 minutes to achieve crystallization of the LSC layer and then immediately removed from the furnace.

The crystalline LSC layer produced exhibited a thickness of 0.3 μm and exhibited a sheet resistance of 800 ohms/sq. at a current density of 10 μamperes, as measured with a four point probe at room temperature. This established the utility of the LSC layer as an electrical conductor for use at ambient temperatures.

X-ray analysis of the layer confirmed that it exhibited a tetragonal K$_2$NiF$_4$ crystal structure. For purposes of comparing the crystalline properties of the LSC layer with that of the corresponding bulk material a sample of Precursor LSC-2 was placed in a crucible and heated on a hot plate to about 450° C. to produce an amorphous LSC bulk composition. The amorphous LSC bulk composition was crystallized by heating to 900° C. for 15 minutes. X-ray diffraction analysis confirmed that both the thin crystalline layer and the bulk composition exhibited a tetragonal K$_2$NiF$_4$ crystal structure.

Sheet resistance of the crystalline LSC layer on the strontium titanate substrate was measured as a function of temperature as the coated article was cooled to the temperature of liquid helium. A superconducting transition ($T_c$) was observed at approximately 40° K., which matched that previously reported for the bulk LSC composition (note P-4 cited above). However, although sheet resistance declined from $T_c$ to about 25° K. further cooling was accompanied by increasing sheet resistance. Thus, the onset of superconductivity was observed, but superconductivity itself was not realized.

Figure 4:
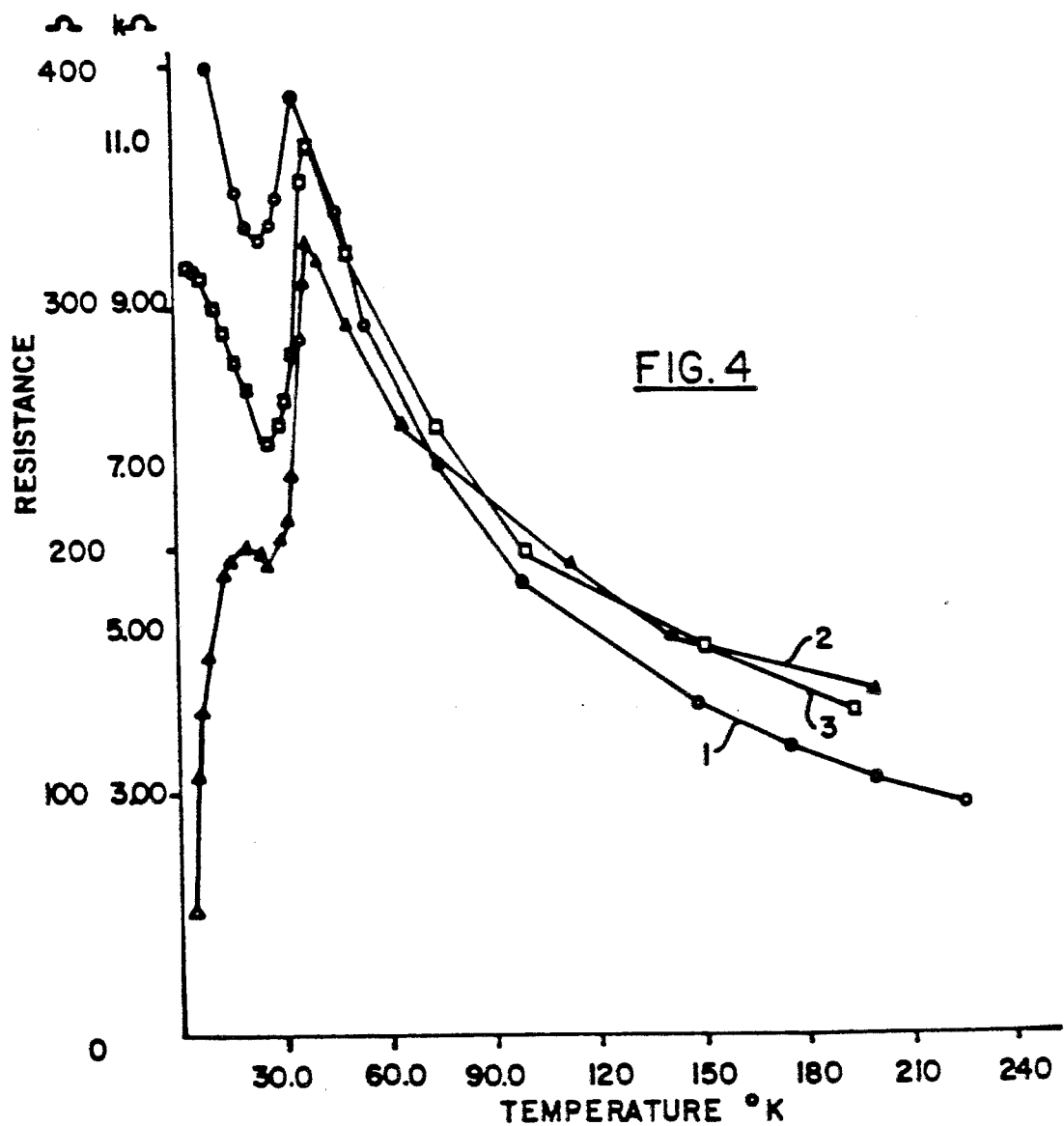

A plot of resistance versus temperature is shown in FIG. 4 as Curve 1. Curve 1 is plotted employing the kilo ohms scale as the ordinate.

Example 2

This example illustrates the increase of conductivity levels realizable below the $T_c$ temperature by forming the amorphous LSC layer in multiple process sequences.

The procedure of Example 1 was repeated, except that the layer forming process sequence of Example 1 prior to crystallization was performed sequentially three times. For economy of expression the resulting article is referred to as a 3 pass article. Although the process sequence was repeated three times, three crystalline layers were not discernable by microscopic inspection.

A plot of resistance versus temperature is shown in FIG. 4 as Curve 2. Curve 2 is plotted employing the ohms scale as the ordinate. While Curve 2 resistance was overall much lower than that exhibited by Curve 1, this difference is at least partially attributable to the increased LSC layer thickness of this example. Curve 2, like Curve 1, exhibits a transitory minimum resistance at approximately 25° K., but, unlike Curve 1, Curve 2 shows a further steep drop in resistance below 25° K.

Example 3

This example is a repetition of Example 2, but with the duration of heating to 950° C. increased from 5 minutes to 30 minutes. The results are plotted as Curve 3 in FIG. 4, wherein the ohms scale is employed as the ordinate. Low temperature conductance characteristics were between those of Examples 1 and Example 2, but, considering the differences in the resistance scales, much closer to the performance characteristics of Example 1.

This example illustrates that increasing the opportunity for substrate interaction with the LSC layer by increasing the duration of heating to the peak temperature for crystallization degrades low temperature conductivity properties, but that, even with this relatively unfavorable process variance, the 3 pass article is still significantly superior to the single pass article of Example 1.

Examples 4 and 5

Figure 5:
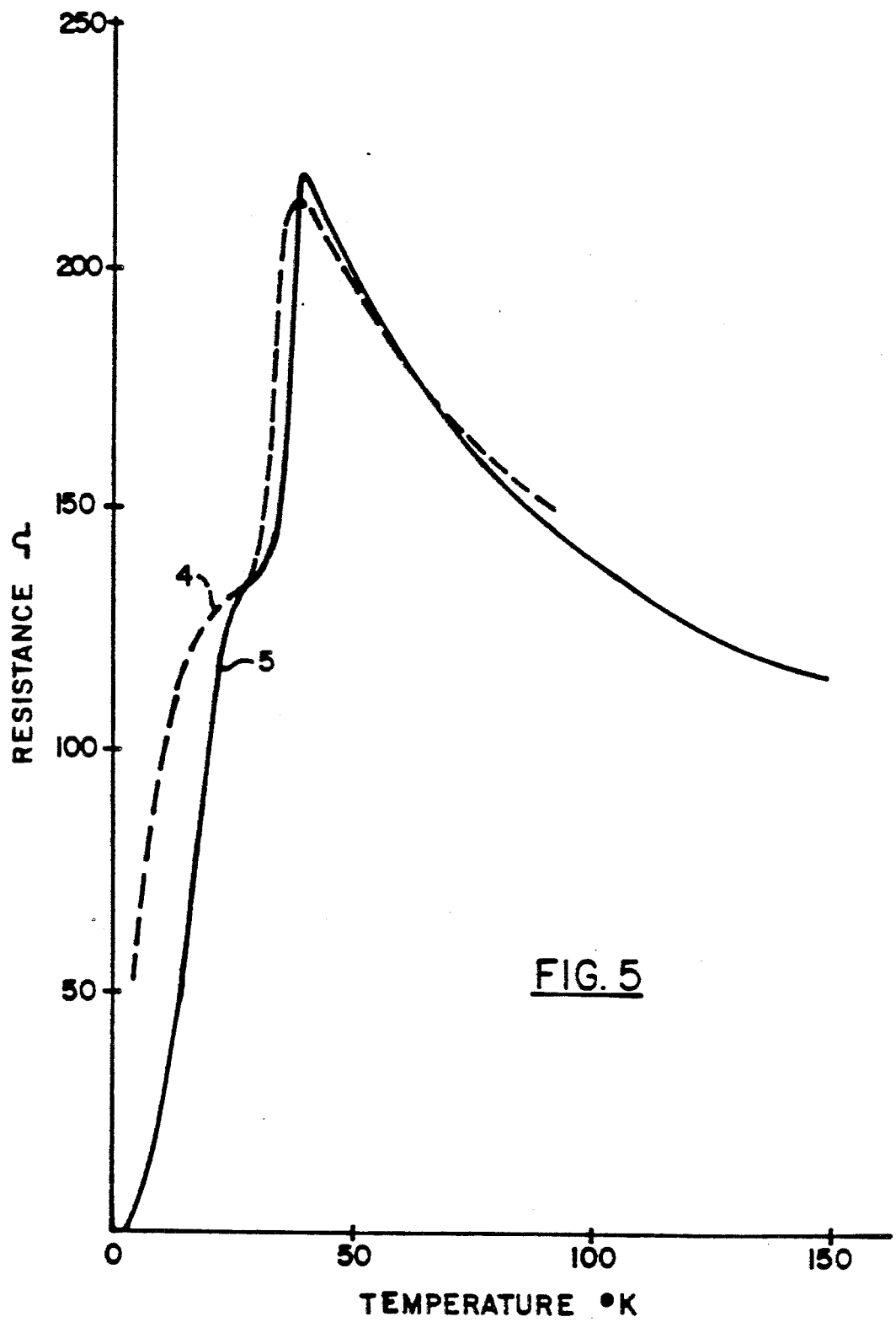

Examples 4 and 5 were repetitions of Example 2, except that the layer forming process sequence was performed 4 and 7 times, respectively. Performance results are compared in FIG. 5, where Curve 4 represents the performance of the 4 pass article of Example 4 and Curve 5 represents the performance of the 7 pass article of Example 5.

These examples confirm the trend, established by comparing Examples 1 and 2, that the perturbation of resistance reduction in cooling below $T_c$ can be progressively reduced by increasing the amorphous layer forming process sequence from 1 to 3 to 4 to 7 passes at 10° K. the resistance of the 7 pass article was substantially less than that of the 4 pass article.

Example 6

Example 5 was repeated, but with an additional 5 minute heating to 1000° C. immediately following the step of heating for 5 minutes at 950° C. Article performance was similar to that of Example 5.

Example 7

Example 6 was repeated, but with LSC-3 substituted for LSC-2. Article performance was similar to that of Examples 5 and 6.

Example 8

Example 5 was repeated, but, instead of removing the article from the oven at the conclusion of heating at 950° C. for 5 minutes, the oven was allowed to cool at the rate of 25° C. per minute. When the oven reached 400° C. the article was removed. Following cooling the article was maintained in an oxygen atmosphere at 500° C. for 1 hour.

Sheet resistance at room temperature was lower than that observed in any of the prior examples, being in the range of approximately 20 ohms/sq. Further, resistance declined progressively with decreasing temperatures, as is characteristic of metals. At just below 9° K. the resistance of the article fell below the minimum measurable resistance of approximately $10^{-5}$ ohm. Thus superconductivity was demonstrated. $T_c$ was approximately 30°

K. A slight, but discernable perturbation in resistance reduction as a function of temperature reduction was observed.

Example 9

Example 8 was repeated, but with an addition al 5 minute heating to 1000° C. immediately following the step of heating for 5 minutes at 950° C. Further, heating in oxygen for one hour was omitted from the process sequence.

Figure 6:
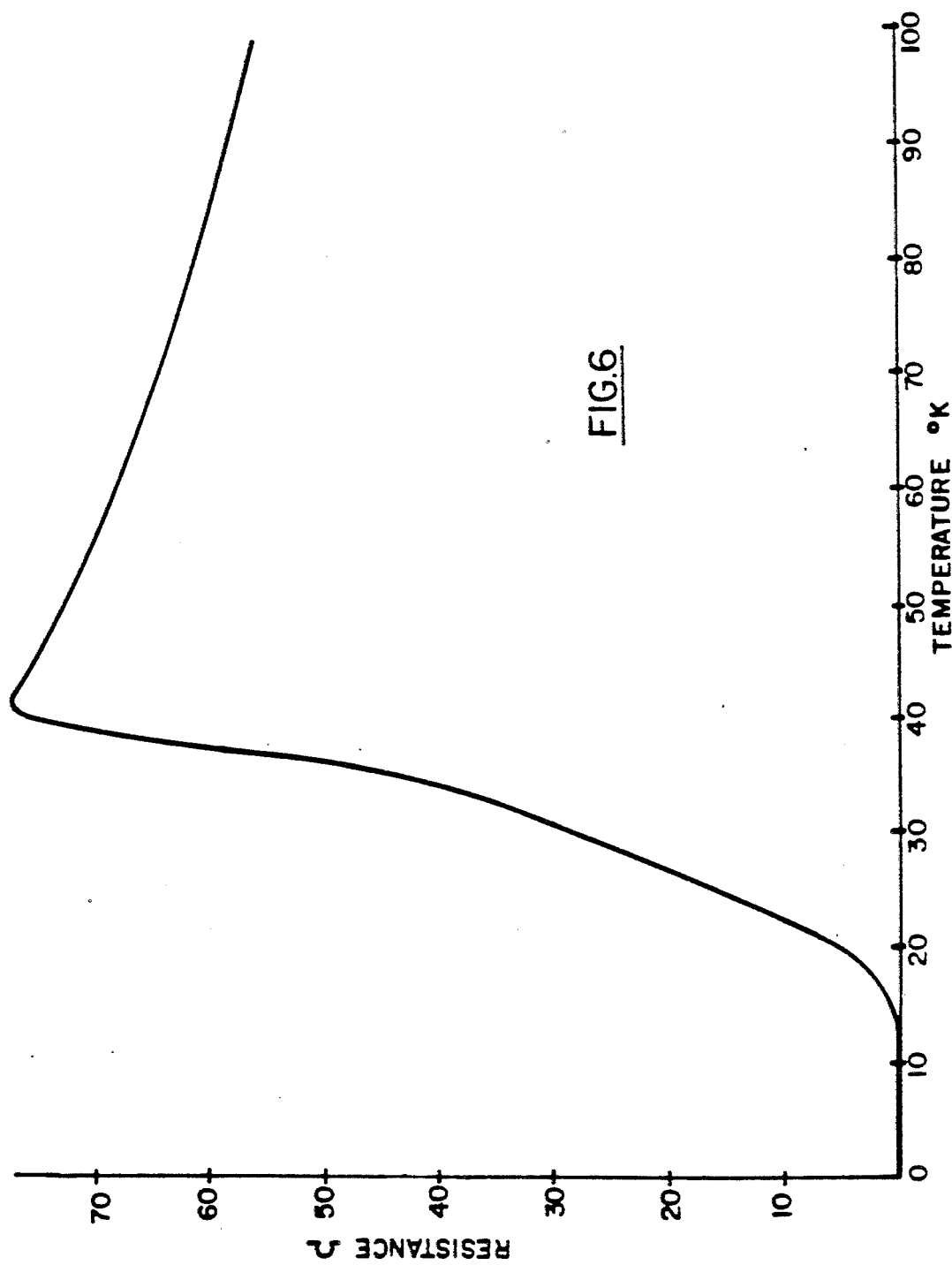

Resistance at room temperature was somewhat higher than in Example 8. FIG. 6 plots temperature versus resistance for temperatures below 100° K. $T_c$ was increased to 40 to 41° K. A steeper decline in resistance as a function of temperature reduction was observed than in any prior example. Superconductivity was observed at 13° K. and below. An X-ray diffraction pattern of the crystalline LSC layer indicated a high degree of crystallization in the desired tetragonal $K_2NiF_4$ phase.

Example 10

Example 9 was repeated, but with the layer following cooling at a controlled rate being held in oxygen at 500° C. for 1 hour in each layer forming process sequence.

Resistance at room temperature was reduced and resistance declined progressively with temperature, as is characteristic of metals, similarly as observed in Example 8 above. Resistances close to $T_c$ were higher than those of Example 8, but reductions in resistance with cooling below $T_c$ were similar.

Example 11

This example illustrates the preparation of a high $T_c$ (>30° K.) electrically conductive artile prepared by forming a YBC layer on a strontium titanate substrate.

A monorystalline strontium titanate ($SrTiO_3$) plate presenting a {100} upper crystal face was employed as a substrate. A small amount of Precursor YBC-1 was placed on the substrate, which was then spun at 4000 rpm for 20 seconds. A uniform, smooth coating was produced that exhibited no physical imperfections on visual inspection, confirming the favorable rheological properties of Precursor YBC 1 as a coating composition. The coated substrate was then heated on a hot plate to 650° C. to produce an amorphous YBC layer. The foregoing process sequence was performed 7 times.

To form the final crystalline YBC layer the article was rapidly heated to 925° C. The article was held at this temperature for 5 minutes to achieve crystallization of the YBC layer.

At the conclusion of the 5 minutes the article was allowed to cool slowly at the rate of 25° C. per minute to a temperature of 400° C. and then removed from the firing oven. The article was then held for 1 hour at 700° C. in an oxygen atmosphere and then slowly cooled at 20° C. per minute.

Figure 7:
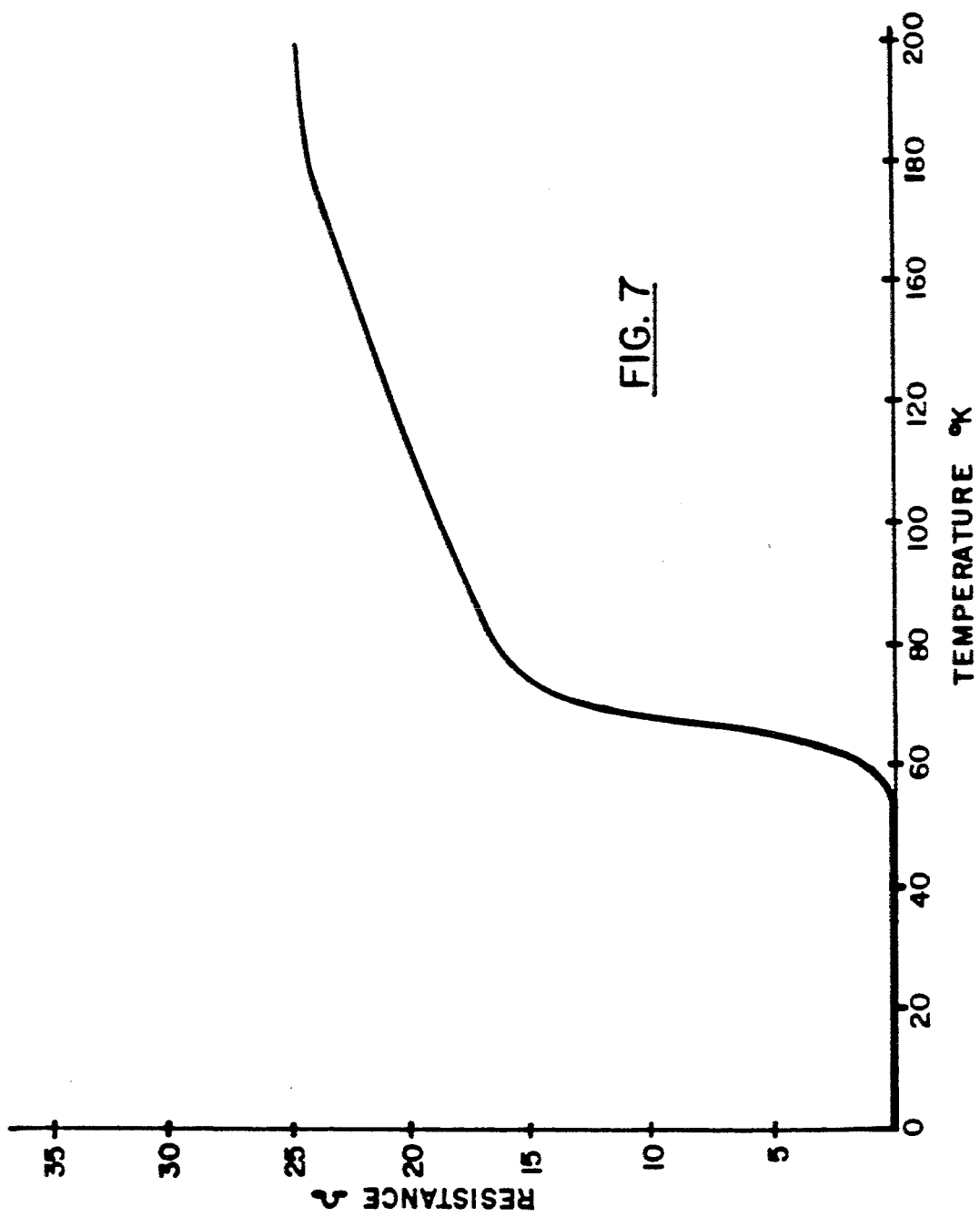

The crystalline YBC layer exhibited a sheet resistance in the range of 20 ohms/sq at room temperature. Resistance declined progressively with decreasing temperature, as is characteristic of metals. FIG. 7 plots temperature versus resistance for temperatures below 200° K. A $T_c$ of 85° K. was observed. Superconductivity (immeasurably low resistance) was observed at 53° K. and lower temperatures. No perturbation of resistance as a function of temperature was noted below the superconducting transition temperature.

X-ray diffraction analysis of the crystalline layer confirmed that it exhibited an $R_1A_2C_3$ crystal structure. Microscopic examination revealed primarily (>90% by volume of the total layer) microcrystals of about 2 μm in mean diameter. A second phase in the form of a few crystalline whiskers was also present.

Example 12

This example illustrates the preparation of a crystalline RAC layer according to the invention on a metal substrate.

A small amount of Precursor LSC-2 was placed on the surface of a copper sheet and formed into a smooth, uniform coating by spinning the substrate at 2500 rpm for 20 seconds. The resulting coated article was then heated to 650° C. until an amorphous LSC layer was formed. The amorphous LSC layer was crystallized by heating to 700° C. for 2 minutes.

The crystalline LSC layer produced adhered well to the copper sheet employed as a substrate. A layer of oxide was noted to cover the surfaces of the substrate not coated by the LSC layer. While the crystalline LSC layer was electrically conductive, no measurable electrical conduction between probes attached to the LSC layer and copper sheet was observed. This suggested that an insulative layer had been formed between the crystalline LSC layer and the copper sheet, probably a copper oxide.

Example 13

Example 12 was repeated, except that a 1 mil (25.4 μm) copper wire was substituted for the copper sheet employed as a substrate. The copper wire was coated by drawing it vertically out of a reservoir containing Precursor LSC 2. While annular in configuration the LSC layer was otherwise similar to that of Example 12.

This example demonstrates the ability to form crystalline RAC layers on metal wires. The advantage of employing a wire as a substrate is that the resulting crystalline layer much more resilient than would be Possible if an entire article were formed of the crystalline RAC composition.

Example 14

Example 13 was repeated, but with a glass fiber 1 mil (25.4 μm) substituted for the copper wire. A uniform coating was formed when the glass fiber was withdrawn from the precursor solution at a rate of 1 mm/sec or less. The crystalline LSC layer exhibited an effective sheet resistance of 1 kilo-ohm/sq. at room temperature.

Example 15

This example demonstrates the feasibility of preparing a conductive article employing a YBC layer which exhibits in addition to the $R_1A_2C_3$ crystalline phase a second phase.

For the purpose of comparing bulk crystalline Properties Precursor YBC 2 employed as a starting material was placed in a crucible and heated on a hot plate to produce an amorphous YBC bulk composition. The amorphous YBC bulk composition was divided into two samples crystallized by heating to 925° C. for 5 and 20 minutes, respectively. X-ray diffraction analysis showed the sample heated for 5 minutes to contain barium carbonate peaks, but these were absent from the sample heated for 20 minutes. The latter sample exhibited an $R_1A_2C_3$ crystalline structure with a second phase indicated by a strong peak at 29.3°.

A monocrystalline strontium titanate (SrTiO$_3$) plate presenting a {100} upper crystal face was employed as a substrate. A small amount of Precursor YBC-2 was placed on the substrate, which was then spun at 5000 rpm for 20 seconds. A uniform, smooth coating was produced that exhibited no physical imperfections on visual inspection, confirming the favorable rheological properties of Precursor YBC-2 as a coating composition. The coated substrate was then heated on a hot plate to 650° C. to produce an amorphous YBC layer. The process sequence up to this point was performed 7 times in sequence for each sample.

Different samples of the film were then heated to 925° C. for 5 minutes and 15 minutes, respectively, to achieve crystallization of the YBC layers. Microscopic analysis showed fewer coating defects in the 5 minute sample and somewhat larger mean microcrystal grain sizes in the 15 minute sample.

A third sample was then prepared as described above employing crystallization for 5 minutes at 925° C. followed by cooling at the rate of 25° C. per minute to a temperature below 500° C. At this point the oven door was opened, allowing more rapid cooling.

At room temperature the third sample exhibited a sheet resistance of 230 ohms/sq. The third sample was then heated to 700° C. rapidly in an oxygen atmosphere, held at that temperature for 1 hour, and then allowed to cool slowly. At room temperature sheet resistance was 160 ohms/sq.. showing a significant reduction in sheet resistance attributable to oxygen annealing. $T_c$ was observed to be 65° K.

Example 16

This example demonstrates the feasibility of preparing a conductive article employing a YBC layer which exhibits in addition to the $R_1A_2C_3$ crystalline phase an even larger second phase than in the preceding example.

The procedure described in Example 15 for the third sample was repeated, but with Precursor YBC-3 substituted for YBC-2. A sheet resistance of 160 ohms/sq. was observed at room temperature prior to oxygen saturation and 110 ohms/sq. after oxygen saturation. Microscopic examination of the YBC layer showed a much larger proportion of second phase material present, resulting in a less uniform coating.

Figure 8:
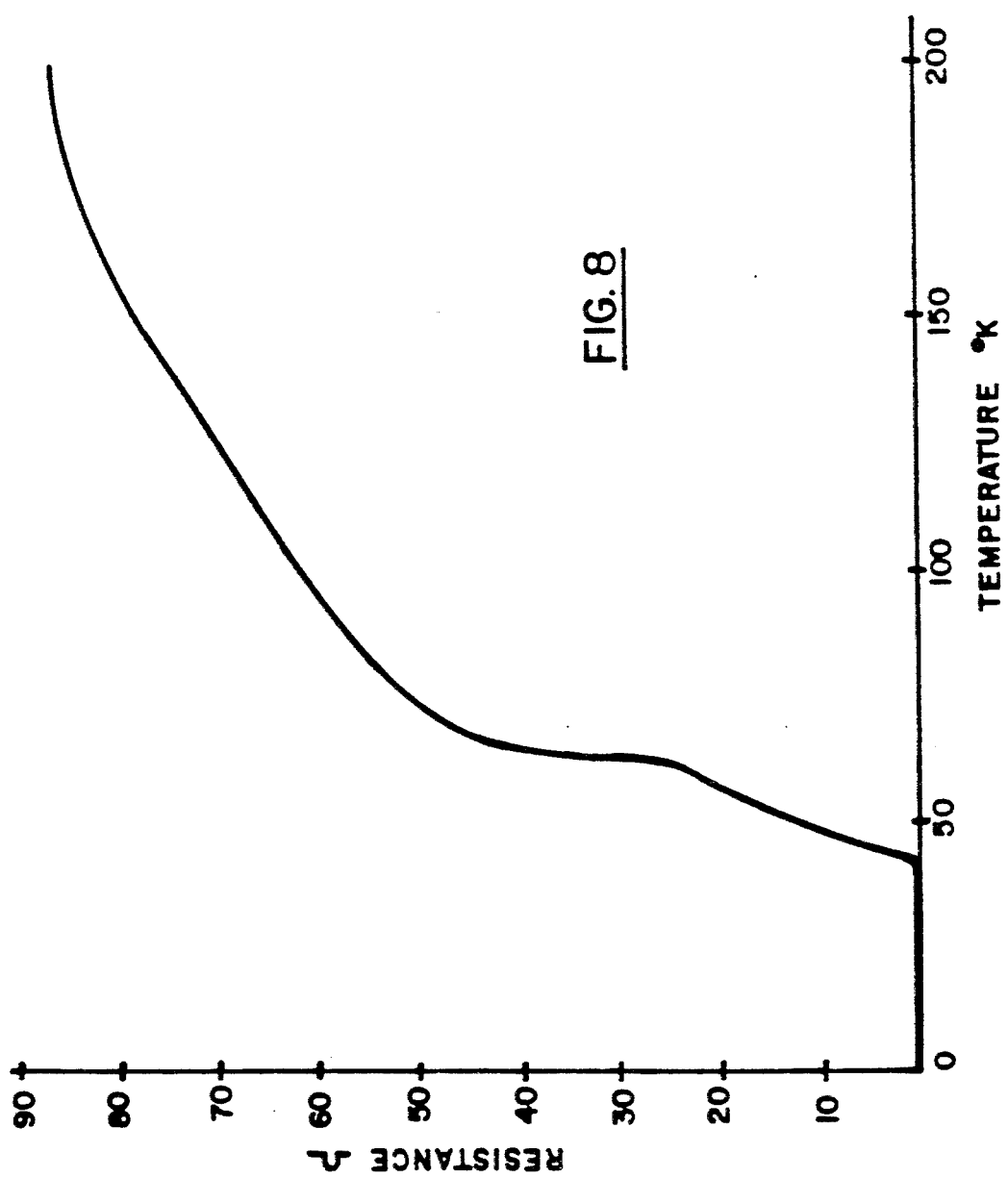

Surprisingly, however, this example exhibited superconductivity characteristics superior to those exhibited by third sample of the previous example. A plot of temperature versus resistance for the third sample is shown in FIG. 8. A maximum resistance was observed at 210° K. Resistance dropped rapidly with further decrease in temperature, with $T_c=92°$ K. and zero resistivity being observed at temperatures of 43° K. and below.

Example 17

This example illustrates the formation of a high conductivity magnet coil by the process of this invention.

An amorphous LSC layer was deposited on a 1102 sapphire substrate following the three pass amorphous LSC layer formation process described in Example 2.

The amorphous LSC layer of the article was prepared for photoresist adhesion by being soaked for 30 seconds with hexamethyldisilazane. The article was then spun at 2500 rpm for 40 seconds. Next a uniform layer of positive working photoresist (commercially available as ROK Industries PPK3135 30.5) was applied to the amorphous LSC layer, and the article was again spun at 2500 rpm for 40 seconds. A smooth, uniform photoresist layer was formed, which was dried by heating to 80° C. for 20 minutes.

A mask for preparing an etched coil pattern found in conventional planar magnets was laid on the surface of the dried photoresist. The mask formed a coiled line pattern 125 to 250 μm in width with a spacing of 125 μm between adjacent line portions. The overall coil diameter was about 2.5 cm. Using an Oriel Corp. of America ultraviolet light source, the mask was held by vacuum deformation of a flexible diaphragm in intimate with the photoresist layer and against a transparent plate. Exposure through the transparent plate with ultraviolet radiation was for 12 at 17 mW/cm$^2$.

The pattern exposed photoresist was developed by being vertically dipped for 60 seconds in developer (ROK Industries positive working photoresist developer diluted 1:1 on a volume basis with deionized water). After development the article was rinsed with deionized water for 3 minutes. The article was then dried by heating for 2 minutes at 90° C.

The portions of the amorphous LSC layer not protected by photoresist were then removed by etching, using a chromium etchant (commercially available as type TFD from Engelhard Industries) diluted with about 250 cc of deionized water to 5 to 10 cc of etchant.

Following etching away of the unprotected LSC layer, the remaining photoresist not exposed to ultraviolet radiation was removed by spraying with acetone followed by spraying with isopropyl alcohol while the article was being spun.

The article produced was observed to exhibit a sharp image pattern corresponding to the desired magnetic coil pattern. No visible trace of LSC on the substrate between the convolutions of the coil was observed.

The invention has been described in detail with particular reference to preferred embodiments thereof, but it will be understood that variations and modifications can be effected within the spirit and scope of the invention.

What is claimed is:

1. An article comprised of a substrate and an electrically conductive layer located on the substrate characterized in that the electrically conductive layer is comprised of greater than 45 percent by volume of a crystalline rare earth alkaline earth copper oxide exhibiting a ratio of metals satisfying (Ia) or (IIa)

$$L_{2-x}:M_x:C:O_y \tag{Ia}$$

$$Y_1:A_2:C_3:O_z \tag{IIa}$$

and the substrate is comprised of alumina, where
A is alkaline earth;
C is copper;
L is lanthanide;
M is alkaline earth;
Y is yttrium;
x is 0.05 to 0.30;
y is the amount of oxygen that results from
 (a) heating an amorphoux mixture of oxides of L, M and C satisfying the ratio $$L_{2-x}:M_x:C \tag{I}$$

in the form of a coating having a thickness of 1 μm or less on the substrate to a temperature in the range of from 925° to 975° C. to form a crystalline phase, (b) effecting crystal growth by heating in the temperature range of from 975° to 1050° C., and (c) cooling the coating in the presence of oxygen at a rate of less than 25° C. per minute until it reaches a temperature of from 550° to 450° C.; and z is the amount of oxygen that results from (a) heating an amorphous mixture of oxides of Y, A and C satisfying the ratio $$Y_1:A_2:C_3 \qquad (II)$$

in the form of a coating having a thickness of 1 μm or less on the substrate to a temperature in the range of from 900° to 950° C. to form a crystalline phase and (b) cooling the coating in the presence of oxygen at a rate of less than 25° C. per minute until it reaches a temperature of from 750° to 400° C.

2. An article comprised of a substrate and an electrically conductive layer located on the substrate characterized in that the electrically conductive layer is comprised of greater than 45 percent by volume of a crystalline rare earth alkaline earth copper oxide exhibiting a ratio of metals satisfying (Ia) or (IIa)

$$L_{2-x}:M_x:C:O_y \qquad (Ia)$$

$$Y_1:A_2:C_3:O_z \qquad (IIa)$$

and the substrate is comprised of glass, where
A is alkaline earth;
C is copper;
L is lanthanide;
M is alkaline earth;
Y is yttrium;
x is 0.05 to 0.30;
y is the amount of oxygen that results from (a) heating an amorphous mixture of oxides of M and C satisfying the ratio $$L_{2-x}:M_x:C \qquad (I)$$

in the form of a coating having a thickness of 1 μm or less on the substrate to a temperature in the range of from 925° to 975° C. to form a crystalline phase.

(b) effecting crystal growth by heating in the temperature range of from 975° to 1050° C., and (c) cooling the coating in the presence of oxygen at a rate of less than 25° C. per minute until it reaches a temperature of from 550° to 450° C.; and z is the amount of oxygen that results from (a) heating an amorphous mixture of oxides of Y, A and C satisfying the ratio $$Y_1:A_2:C_3 \qquad (II)$$

in the form of a coating having a thickness of 1 μm or less on the substrate to a temperature in the range of from 900° to 950° C. to form a crystalline phase and (b) cooling the coating in the presence of oxygen at a rate of less than 25° C. per minute until it reaches a temperature of from 750° to 400° C.

3. An article comprised of a substrate an dan electrically conductive layer located on the substrate characterized in that the electrically conductive layer is comprised of greater than 45 percent by volume of a crystalline rare earth alkaline earth copper oxide exhibiting a ratio of metals satisfying (Ia) or (IIa)

$$L_{2-x}:M_x:C:O_y \qquad (I)$$

$$Y_1:A_2:C_3:O_z \qquad (II)$$

and the substrate is comprised of metal,
where
A is alkaline earth;
C is copper;
L is lanthanide;
M is alkaline earth;
Y is yttrium;
x is 0.05 to 0.30;
y is the amount of oxygen that results from (a) heating an amorphous mixture of oxides of L, M and C satisfying the ratio $$L_{2-x}:M_x:C \qquad (I)$$

in the form of a coating having a thickness of 1 μm or less on the substrate to a temperature in the range of from 925° to 975° C. to form a crystalline phase, (b) effecting crystal growth by heating in the temperature range of from 975° to 1050° C., and (c) cooling the coating in the presence of oxygen at a rate of less than 25° C. per minute until it reaches a temperature of from 550° to 450°; and z is the amount of oxygen that results from (a) heating an amorphous mixture of oxides of Y, A and C satisfying the ratio $$Y_1:A_2:C_3 \qquad (II)$$

in the form of a coating having a thickness of 1 μm or less on the substrate to a temperature in the range of from 900° to 950° C. to form a crystalline phase and (b) cooling the coating in the presence of oxygen at a rate of less than 25° C. per minute until it reaches a temperature of from 750° to 400° C.

4. An article according to claim 3 further characterizes in that at least the surface of the substrate contacting the conductive layer is comprised of a refractory metal.

5. An article comprised of a substrate and an electrically conductive layer located on the substrate characterized in that the electrically conductive layer is comprised of greater than 45 percent by volume of a crystalline rare earth alkaline earth copper oxide exhibiting a ratio of metals satisfying (Ia) or (IIa)

$$L_{2-x}:M_x:C:O_y \qquad (I)$$

$$Y_1:A_2:C_3:O_z \qquad (II)$$

and the substrate is comprised of an alkaline earth oxide, where
- A is alkaline earth;
- C is copper;
- L is lanthanide;
- M is alkaline earth;
- Y is yttrium;
- x is 0.05 to 0.30;
- y is the amount of oxygen that results from
  - (a) heating an amorphous mixture of oxides of L, M and C satisfying the ratio $$L_{2-x}:M_x:C \qquad (I)$$

in the form of a coating having a thickness of 1 μm or less on the substrate to a temperature in the range of from 925° to 975° C. to form a crystalline phase,
  - (b) effecting crystal growth by heating in the temperature range of from 975° to 1050° C., and
  - (c) cooling the coating in the presence of oxygen at a rate of less than 25° C. per minute until it reaches a temperature of from 550° to 450° C. and

- z is the amount of oxygen that results from
  - (a) heating an amorphous mixture of oxides of Y, A and C satisfying the ratio $$Y_1:A_2:C_3 \qquad (II)$$

in the form of a coating having a thickness of 1 μm or less on the substrate to a temperature in the range of from 900° to 950° C. to form a crystalline phase and
  - (b) cooling the coating in the presence of oxygen at a rate of less than 25° C. per minute until it reaches a temperature of from 750° to 400° C.

6. An article according to claim 5 further characterized in that the electrically conductive layer exhibits superconductivity at a temperature in excess of 10° K. and the substrate is comprised of magnesia.

7. An article comprised of a substrate and an electrically conductive layer located on the substrate characterized in that
the electrically conductive layer is comprised of greater than 45 percent by volume of a crystalline rare earth alkaline earth copper oxide exhibiting a ratio of metals satisfying (Ia) or (IIa)

$$L_{2-x}:M_x:C:O_y \qquad (Ia)$$

$$Y_1:A_2:C_3:O_z \qquad (IIa)$$

and the substrate exhibits a perovskite crystal structure,
where
- A is alkaline earth;
- C is copper;
- L is lanthanide;
- M is alkaline earth;
- Y is yttrium;
- x is 0.05 to 0.30;
- y is the amount of oxygen that results from
  - (a) heating an amorphous mixture of oxides of L, M and C satisfying the ratio $$L_{2-x}:M_x:C \qquad (I)$$

in the form of a coating having a thickness of 1 μm or less on the substrate to a temperature in the range of from 925° to 975° C. to form a crystalline phase,
  - (b) effecting crystal growth by heating in the temperature range of from 975° to 1050° C., and
  - (c) cooling the coating in the presence of oxygen at a rate of less than 25° C. per minute until it reaches a temperature of from 550° to 450° C.; and

- z is the amount of oxygen that results from
  - (a) heating an amorphous mixture of oxides of Y, A and C satisfying the ratio $$Y_1:A_2:C_3 \qquad (II)$$

in the form of a coating having a thickness of 1 μm or less on the substrate to a temperature in the range of from 900° to 950° C. to form a crystalline phase and
  - (b) cooling the coating in the presence of oxygen at a rate of less than 25° C. per minute until it reaches a temperature of from 750° to 400° C.

8. An article according to claim 7 further characterized in that the electrically conductive layer exhibits superconductivity at a temperature in excess of 10° K. and the substrate is comprised of strontium titanate.

9. An article according to claim 7 further characterized in that the metal is copper.

10. An article according to any one of claims 1, 5, 6, 7, 8, 2, 3, 9 and 4 further characterized in that the conductive layer is restricted to a portion of the substrate thereby defining a conduction path on the substrate.

11. An article according to claim 2, 9 or 3 further characterized in that the substrate is of an elongated configuration and the conductive layer forms a conductive sheath surrounding the substrate.

12. An article according to claim 11 further characterized in that both the substrate and the conductive layer are flexible.

13. An article according to claim 12 further characterized in that the conductive layer has a thickness of 2 μm or less.

14. An article according to any one of claims 1, 5, 6, 7 and 8 further characterized in that the substrate is monocrystalline.

15. An article according to any one of claims 1, 6, 7, 8, 2, 3, or 9 further characterized in that a barrier is interposed between the substrate and the electrically conductive layer.

16. An electrically conductive article according to any one of claims 5, 6, 7, or 8 further characterized in that the conductive layer exhibits a superconducting transition temperature of at least 30° K.

17. An article according to claim 16 further characterized in that the conductive layer exhibits a superconducting transition temperature of at least 80° K. and is comprised of an $R_1A_2C_3$ crystalline phase.

18. An article according to any one of claims 1, 5, 6, 7, 8, 2, 3, 9 or 4 further characterized in that the conductive layer consists of greater than 70 percent by volume of a crystalline conductive phase.

19. An article according to claim 18 further characterized in that the conductive layer consists of greater than 90 percent by volume of a crystalline conductive phase.

20. An article according to any one of claims 1, 5, 6, 7, 8, 2, 3, and 4 further characterized in that greater than 45 percent by volume of the conductive layer consists essentially of a rare earth alkaline earth copper oxide which is in an tetragonal $K_2NiF_4$ crystalline form.

21. An article according to claim 20 further characterized in that the rare earth alkaline earth copper oxide satisfies the metal ratio:

$$L_{2-x}:M_x:Cu$$

where
L is lanthanide,
M is alkaline earth metal, and
x is 0.05 to 0.30.

22. An article according to claim 18 further characterized in that greater than 70 percent by volume of the conductive layer consists essentially of a rare earth alkaline earth copper oxide which satisfies the metal ratio $$L_{2-x}:M_x:Cu$$

where
L is lanthanide,
M is alkaline earth metal, and
x is 0.050 to 0.30.

23. An article according to claim 22 further characterized in that the lanthanide is lanthanum and the alkaline earth metal is barium or strontium.

24. An article according to claim 22 further characterized in that x is 0.15 to 0.20.

25. An article according to any one of claims 1, 5, 6, 7, 8, 2, 3, 9 and 4 further characterized in that greater than 45 percent by volume of the conductive layer consists essentially of a rare earth alkaline earth copper oxide which is in an $R_1A_2C_3$ crystalline phase.

26. An article according to claim 25 further characterized in that the rare earth alkaline earth copper oxide consists of yttrium as the rare earth and barium, optionally in combination with at least one of strontium and calcium, as the alkaline earth.

27. A superconductive article comprised of a substrate and a superconductive layer located on the substrate, characterized in that
the layer exhibits superconductivity at a temperature in excess of 10° K. and consists of greater than 45 percent by volume of a crystalline tetragonal $K_2NiF_4$ phase consisting essentially of a rare earth alkaline earth copper oxide satisfying (Ia):

$$L_{2-x}:M_x:Cu:O_y$$

where
L is lanthanum,
M is strontium, and
x is 0.050 to 0.30,
y is the amount of oxygen which results from
(a) forming an amorphous oxide coating having a thickness of less than 1 μm by (i) preparing a solution comprised of a volatile film-forming solvent and metalcarboxylate ligand compounds of the lanthanum, strontium and copper in the mole ratio (I)

$$L_{2-x}:M_x:C \quad (I)$$

where L, M, C and x are as indicated above, (ii) coating the solution on the substrate, and (iii) removing the solvent and ligands from the substrate by heating in the presence of oxygen, (b) heating the amorphous oxide to a temperature in the range of from 925° to 975° C. to form a crystalline phase,
(c) effecting crystal growth by heating in the temperature range of from 975° to 1050° C., and
(d) cooling the coating in the presence of oxygen at a rate of less than 25° C. per minute until it reaches a temperature of from 550° to 450° C.; and
the substrate consists essentially of monocrystalline strontium titanate.

28. A superconductive article according to claim 27 further characterized in that x is 0.15 to 0.20.

29. A superconductive article according to claim 27 further characterized in that the layer exhibiting superconductivity consists of greater than 90 percent by volume of the crystalline phase.

30. A superconductive article comprised of a substrate and a superconductive layer located on the substrate, characterized in that
the layer exhibits superconductivity at a temperature in excess of 30° K. and consists of greater than 45 percent by volume of an $R_1A_2C_3$ crystalline phase which consists essentially of a rear earth alkaline earth copper oxide,
the rare earth alkaline earth copper oxide consists of yttrium as the rare earth and barium, optionally in combination with strontium as the alkaline earth,
the yttrium, alkaline earth, and copper are present in a 1:2:3 mole ratio n the $R_1A_2C_3$ phase,
the amount of oxygen in the $R_1A_2C_3$ phase is that which results from
(a) forming an amorphous oxide coating having a thickness of less than 1 μm by (i) preparing solution comprised of a volatile film-forming solvent and metal-carboxylate ligand compounds of the yttrium, alkaline earth and copper in the 1:2:3 mole ratio, (ii) coating the solution on the substrate, and (iii) removing the solvent and ligands from the substrate by heating in the presence of oxygen,
(b) heating the amorphous oxide coating to a temperature in the range of from 900° to 950° C. to form a crystalline phase and
(c) cooling the coating in the presence of oxygen at a rate of less than 25° C. per minute until it reaches a temperature of from 750° to 400° C., and
the substrate consists of monocrystalline magnesia or strontium titanate.

31. A superconductive article according to claim 30 further characterized in that the layer exhibiting superconductivity consists of greater than 90 percent by volume of the crystalline phase.

32. A superconductive article according to claim 30 further characterized in that the substrate consists essentially of magnesia.

33. A superconductive article according to claim 30 further characterized in that the substrate consists essentially of strontium titanate.

34. An article comprised of a substrate and a layer of an amorphous metal oxide located on the substrate characterized in that
the amorphous metal oxide is a rare earth alkaline earth copper oxide capable of being converted to an electrically conductive crystalline form accounting for at least 45 percent by volume of the layer, the substrate is comprised of alumina,
the oxide exhibits a ratio of metals satisfying (I) or (II)

$$L_{2-x}:M_x:C \qquad (I)$$

$$R_1:A_2:C_3 \qquad (II)$$

where
A is alkaline earth;
C is copper;
L is lanthanide;
M is alkaline earth;
R is rare earth; and
x is 0.05 to 0.30, and
    the oxygen content of the amorphous oxide coating is that which results from (i) forming a solution comprised of a volatilizable film-forming solvent and metalcarboxylate ligand compounds of the metals and in the proportions of (I) or (II), (ii) coating the solution on the substrate, and (iii) removing the solvent and ligands from the substrate by heating in the presence of oxygen.

35. An article according to claims 34 and inclusive further characterized in that the substrate presents a planar surface and the amorphous metal oxide forms a planar layer on the planar substrate surface.

36. An article according to claim 34 and inclusive further characterized in that a removable protective layer overlies the amorphous layer.

37. An article comprised of a substrate and a layer of an amorphous metal oxide located on the substrate characterized in that
    the amorphous metal oxide is a rare earth alkaline earth copper oxide capable of being converted to an electrically conductive crystalline form accounting for at least 45 percent by volume of the layer,
the substrate is comprised of an alkaline earth oxide,
the oxide exhibits a ratio of metals satisfying (I) or (II)

$$L_{2-x}:M_x:C \qquad (I)$$

$$R_1:A_2:C_3 \qquad (II)$$

where
A is alkaline earth;
C is copper;
L is lanthanide;
M is alkaline earth;
R is rare earth; and
x is 0.05 to 0.30, and
    the oxygen content of the amorphous oxide coating is that which results from (i) forming a solution comprised of a volatilizable film-forming solvent and metalcarboxylate ligand compounds of the metals and in the proportions of (I) or (II), (ii) coating the solution on the substrate, and (iii) removing the solvent and ligands from the substrate by heating in the presence of oxygen.

38. An article according to claim 31 further characterized in that the substrate is magnesia.

39. An article comprised of a substrate and a layer of an amorphous metal oxide located on the substrate characterized in that
    the amorphous metal oxide is a rear earth alkaline earth copper oxide capable of being converted to an electrically conductive crystalline form accounting for at least 45 percent by volume of the layer,
the substrate is exhibits a perovskite crystal structure,
the oxide exhibits a ratio of metals satisfying (I) or (II)

$$L_{2-x}:M_x:C \qquad (I)$$

$$R_1:A_2:C_3 \qquad (II)$$

where
A is alkaline earth;
C is copper;
L is lanthanide;
M is alkaline earth;
R is rare earth; and
x is 0.05 to 0.30, and
    the oxygen content of the amorphous oxide coating is that which results from (i) forming a solution comprised of a volatilizable film-forming solvent and metalcarboxylate ligand compounds of the metals and in the proportions of (I) or (II), (ii) coating the solution on the substrate, and (iii) removing the solvent and ligands from the substrate by heating in the presence of oxygen.

40. An article according to claim 39 further characterized in that the substrate is comprised of strontium titanate.

41. An article comprised of a substrate and a layer of an amorphous metal oxide located on the substrate characterized in that
    the amorphous metal oxide is a rare earth alkaline earth copper oxide capable of being converted to an electrically conductive crystalline form accounting for at least 45 percent by volume of the layer,
the substrate is comprised of glass,
the oxide exhibits a ratio of metals satisfying (I) or (II)

where
A is alkaline earth;
C is copper;
L is lanthanide;
M is alkaline earth;
R is rare earth; and
x is 0.05 to 0.30, and
    the oxygen content of the amorphous oxide coating is that which results from (i) forming a solution comprised of a volatilizable film-forming solvent and metalcarboxylate ligand compounds of the metals and in the proportions of (I) or (II), (ii) coating the solution on the substrate, and (iii) removing the solvent and ligands from the substrate by heating in the presence of oxygen.

42. An article comprised of a substrate and a layer of an amorphous metal oxide located on the substrate characterized in that
    the amorphous metal oxide is a rare earth alkaline earth copper oxide capable of being converted to an electrically conductive crystalline form accounting for at least 45 percent by volume of the layer,
the substrate is comprised of metal,
the oxide exhibits a ratio of metals satisfying (I) or (II)

$$L_{2-x}:M_x:C \qquad (I)$$

$$R_1:A_2:C_2 \qquad (II)$$

where

A is alkaline earth;

C is copper;

L is lanthanide;

M is alkaline earth;

R is rare earth; and x is 0.05 to 0.30, and the oxygen content of the amorphous oxide coating is that which results from (i) forming a solution comprised of a volatilizable film-forming solvent and metalcarboxylate ligand compounds of the metals and in the proportions of (I) or (II), (ii) coating the solution on the substrate, and (iii) removing the solvent and ligands from the substrate by heating in the presence of oxygen.

43. An article according to claim 42 further characterized in that the metal forming the substrate is comprised of copper.

44. An article according to any one of claims 1, 10, 14, 6 or 7, further characterized in that
A is barium optionally in combination with at least one of strontium and calcium.

45. An article according to any one of claims 1, 10, 14, 6 or 7, further characterized in that
L is lanthanum.

46. An article according to any one of claims 1, 10, 14, 6 or 7, further characterized in that
M is at least one of barium and strontium.

47. An article according to any one of claims 1, 10, 14, 6 or 7, further characterized in that
A is barium optionally in combination with at least one of strontium and calcium;
L is lanthanum and
M is at least one of barium and strontium.

* * * * *